United States Patent [19]
Taguchi et al.

[11] Patent Number: 6,034,555
[45] Date of Patent: *Mar. 7, 2000

[54] SEMICONDUCTOR INTEGRATED CIRCUIT WITH INPUT/OUTPUT INTERFACE ADAPTED FOR SMALL-AMPLITUDE OPERATION

[75] Inventors: Masao Taguchi; Satoshi Eto; Yoshihiro Takemae; Hiroshi Yoshioka; Makoto Koga, all of Kawasaki, Japan

[73] Assignee: Fujitsu Limited, Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/718,045

[22] Filed: Sep. 13, 1996

Related U.S. Application Data

[62] Division of application No. 08/076,434, Jun. 14, 1993, Pat. No. 5,557,221.

[30] Foreign Application Priority Data

| Jun. 15, 1992 | [JP] | Japan | 4-154986 |
| Jun. 15, 1992 | [JP] | Japan | 4-154990 |
| Jul. 6, 1992 | [JP] | Japan | 4-178436 |
| Aug. 6, 1992 | [JP] | Japan | 4-210383 |
| Aug. 7, 1992 | [JP] | Japan | 4-211409 |
| Jan. 20, 1993 | [JP] | Japan | 5-007083 |
| May 14, 1993 | [JP] | Japan | 5-112793 |

[51] Int. Cl.⁷ .................................... H03F 3/45
[52] U.S. Cl. ................. 327/53; 327/47; 327/77; 327/91; 327/112
[58] Field of Search .......................... 327/47, 53, 77, 327/91, 112

[56] References Cited

U.S. PATENT DOCUMENTS

| 4,103,190 | 7/1978 | Beutler | 307/362 |
| 4,339,673 | 7/1982 | Perry | 307/270 |
| 4,571,547 | 2/1986 | Day | 328/116 |
| 4,985,646 | 1/1991 | Kunagai et al. | 307/448 |
| 5,019,728 | 5/1991 | Sanwo et al. | 307/475 |
| 5,336,947 | 8/1994 | Lehning | 327/76 |
| 5,378,936 | 1/1995 | Kokubo et al. | 327/77 |
| 5,418,536 | 5/1995 | Lisle et al. | 342/194 |
| 5,483,189 | 1/1996 | Cordini et al. | 327/319 |
| 5,528,172 | 6/1996 | Sundstrom | 327/76 |

FOREIGN PATENT DOCUMENTS

| 0 105 685 | 4/1984 | European Pat. Off. . | |
| 0 482 336 | 4/1992 | European Pat. Off. . | |
| 56-142119 | 10/1981 | Japan . | |
| 360075119 | 4/1985 | Japan | 327/76 |
| 61-19227 | 1/1986 | Japan . | |
| 61-112424 | 5/1986 | Japan . | |
| 61-121033 | 7/1986 | Japan . | |
| 62-178015 | 8/1987 | Japan . | |
| 62-208715 | 9/1987 | Japan . | |
| 63-018719 | 1/1988 | Japan . | |
| 63-114319 | 5/1988 | Japan . | |
| 1-160213 | 6/1989 | Japan . | |
| 1-191517 | 8/1989 | Japan . | |

(List continued on next page.)

OTHER PUBLICATIONS

Patent Abstracts of Japan, vol. 011, No. 130; JP 61–274511.
Patent Abstracts of Japan, vol. 012, No. 357; JP 63–114319.
Patent Abstracts of Japan, vol. 013, No. 483; JP 01–191517.
Patent Abstracts of Japan, vol. 015, No. 479; JP 03–206711.
Patent Abstracts of Japan, vol. 010, No. 297; JP 61–112424.
Patent Abstracts of Japan, vol. 016, No. 447; JP 04–156715.

*Primary Examiner*—Margaret R. Wambach
*Attorney, Agent, or Firm*—Nikaido, Marmelstein Murray & Oram LLP

[57] ABSTRACT

A semiconductor integrated circuit includes a switch unit for controlling the supply of a power source voltage to a signal amplification circuit for receiving an input signal, and a control unit for selectively turning ON and OFF the switch unit in accordance with the amplitude or frequency of the input signal. By the constitution, it is possible to provide an input circuit or an output circuit capable of being applied to an input/output interface adapted for a small amplitude operation.

49 Claims, 21 Drawing Sheets

FOREIGN PATENT DOCUMENTS

| | | |
|---|---|---|
| 2-147933 | 12/1990 | Japan . |
| 3-7424 | 1/1991 | Japan . |
| 4-3618 | 1/1992 | Japan . |
| 418810 | 1/1992 | Japan . |
| 4-049714 | 2/1992 | Japan . |
| 4-156715 | 5/1992 | Japan . |
| 4-258020 | 9/1992 | Japan . |

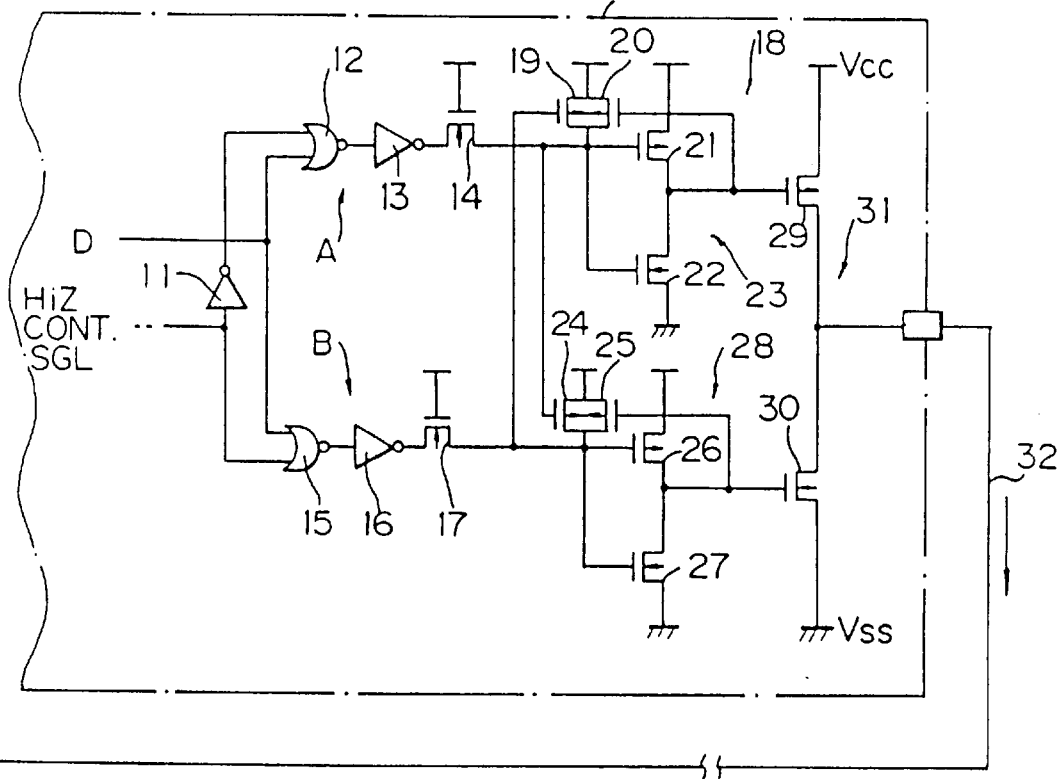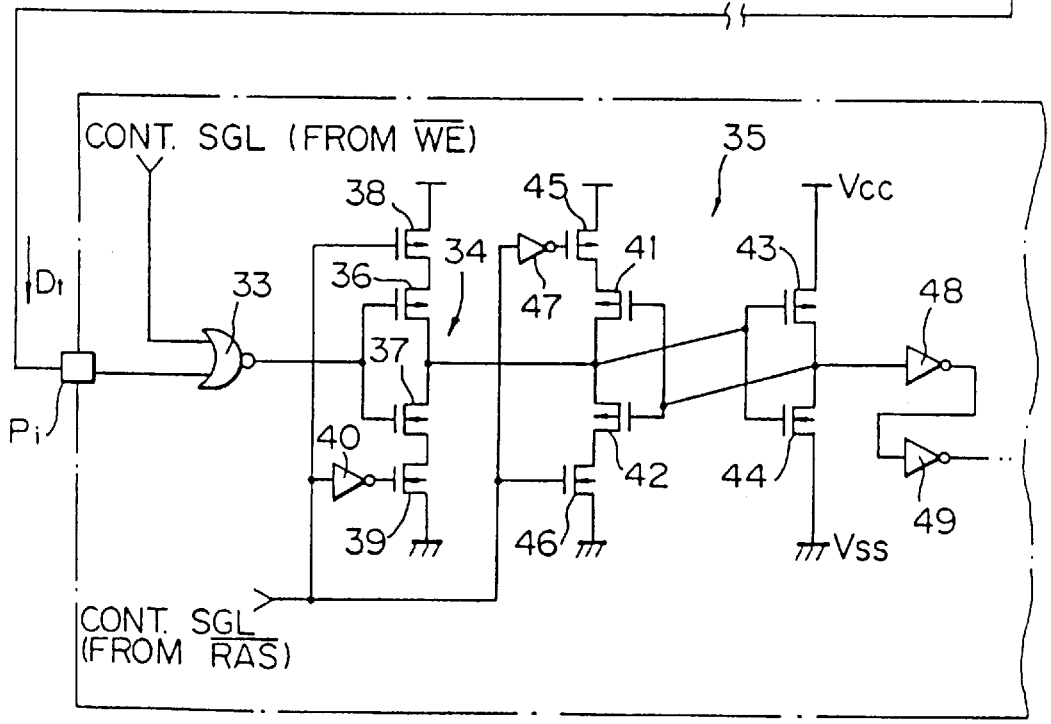
Fig. 1 PRIOR ART

SEMICONDUCTOR INTEGRATED CIRCUIT WITH INPUT/OUTPUT INTERFACE ADAPTED FOR SMALL-AMPLITUDE OPERATION

This is a divisional, of application Ser. No. 08/076,434 filed Jun. 14, 1993 now U.S. Pat. No. 5,557,221.

BACKGROUND OF THE INVENTION

1. Field of the Invention

The present invention relates to a semiconductor integrated circuit (LSI). More particularly, the invention relates to a semiconductor integrated circuit equipped with an input circuit or an output circuit adapted to an interchip input/output interface on a board mounting a plurality of LSI chips, and particularly equipped with an input circuit that can be adapted to both the data that operate with high-frequency clocks (e.g., 50 MHz or higher) (hereinafter referred to as high-speed data) and the data that operate with low-frequency clocks (e.g., 50 MHz or lower)(hereinafter referred to as low-speed data) or equipped with an output circuit that outputs very small-amplitude signals of the CTT (center tapped termination) level or the GTL (gunning transceiver logic) level.

2. Description of the Related Art

So far, the TTL or CMOS level, or the LVTTL (interface specification for 3.3 volt power supply standardized in compliance with JEDEC) has generally been used as the input/output level of the LSIs. With respect to these levels, however, the device is much affected by the reflection of signals or by the crosstalk as the frequency of the transfer data exceeds 50 MHz, and it becomes difficult to normally transfer the data since the waveforms are distorted by ringing and the like. Attention therefore has been given to input/output interfaces (CTT, GTL, rambus channel, etc.) of small amplitudes that suppress the amplitude of the transfer data to be smaller than 1 volt (about ×300 to ±500 Mv). These input/output interfaces make it possible to transfer the data at speeds as high as 100 MHz or more, which is well greater than 50 MHz.

However, conventional semiconductor integrated circuits equipped with such input/output interfaces involve many problems, which will be explained later in detail in contrast with the preferred embodiments of the present invention.

SUMMARY OF THE INVENTION

A main object of the present invention is to provide a semiconductor integrated circuit equipped with an input circuit or an output circuit adapted for an input/output interface suitable for a small-amplitude operation.

A first object of the present invention is to provide a semiconductor integrated circuit equipped with an input circuit that can be adapted for both the high-speed transfer (importance is placed on the transfer speed) and the low-speed transfer (importance is placed on the electric power efficiency.)

A second object of the present invention is to provide a semiconductor integrated circuit which exhibits performance adapted for various modes and excellent compatibility, by using two sets of output transistors having optimum internal resistances depending upon the signal interfaces (CTT or GTL) of very small amplitude levels and the signal interfaces (CMOS or TTL) of large amplitudes.

A third object of the present invention is to provide a semiconductor integrated circuit which is immune to noise and can be well combined with a three-state type output circuit, by optimizing the judgement reference level of a differential amplifier circuit.

A fourth object of the present invention is to provide a semiconductor integrated circuit equipped with an output circuit having excellent compatibility which can be used for every one of CTT, TTL and GTL.

A fifth object of the present invention is to provide a semiconductor integrated circuit which can be used for both the signal interface having a large logic amplitude and the signal interface having a small logic amplitude.

A sixth object of the present invention is to provide a semiconductor integrated circuit equipped with an output circuit which can realize a high-speed operation and enhance the drivability of output transistors.

According to an aspect of the present invention, there is provided a semiconductor integrated circuit comprising: a differential gate which compares the potential of an input signal with a predetermined reference potential to discriminate the logic of the input signal; a selection means which selects either a first reference potential given from outside the chip or a second reference potential formed by a reference potential-generating means in the chip; and an instruction means which instructs the selection means to select the first reference potential when the first reference potential is given, and which instructs the selection means to select the second reference potential when the first reference potential is not given.

According to another aspect of the present invention, there is provided a semiconductor integrated circuit comprising: a logic gate which compares an input signal with a predetermined input threshold value to discriminate the logic of the input signal; a differential gate which compares the potential of the input signal with a reference potential given from outside the chip to discriminate the logic of the input signal; a selection means which selects either the output of the logic gate or the output of the differential gate; and an instruction means which instructs the selection means to select the output of the differential gate when the reference potential is given, and which instructs the selection means to select the output of the logic gate when the reference potential is not given.

circuit comprising: an output circuit which outputs a first output voltage that specifies an "H" level and a second output voltage that specifies an "L" level with respect to a predetermined reference voltage; and a control means which controls the first and second output voltages of under substantially no-load state to, respectively, possess predetermined voltage levels of absolute values which is smaller than the absolute value of the voltage which corresponds to the power-source voltage.

BRIEF DESCRIPTION OF THE DRAWINGS

Other objects and features of the present invention will be described hereinafter in detail by way of preferred embodiments with reference to the accompanying drawings, in which:

FIG. 1 is a diagram illustrating the constitution of an input/output circuit according to a first prior art;

DESCRIPTION OF THE PREFERRED EMBODIMENTS

Figure 2:
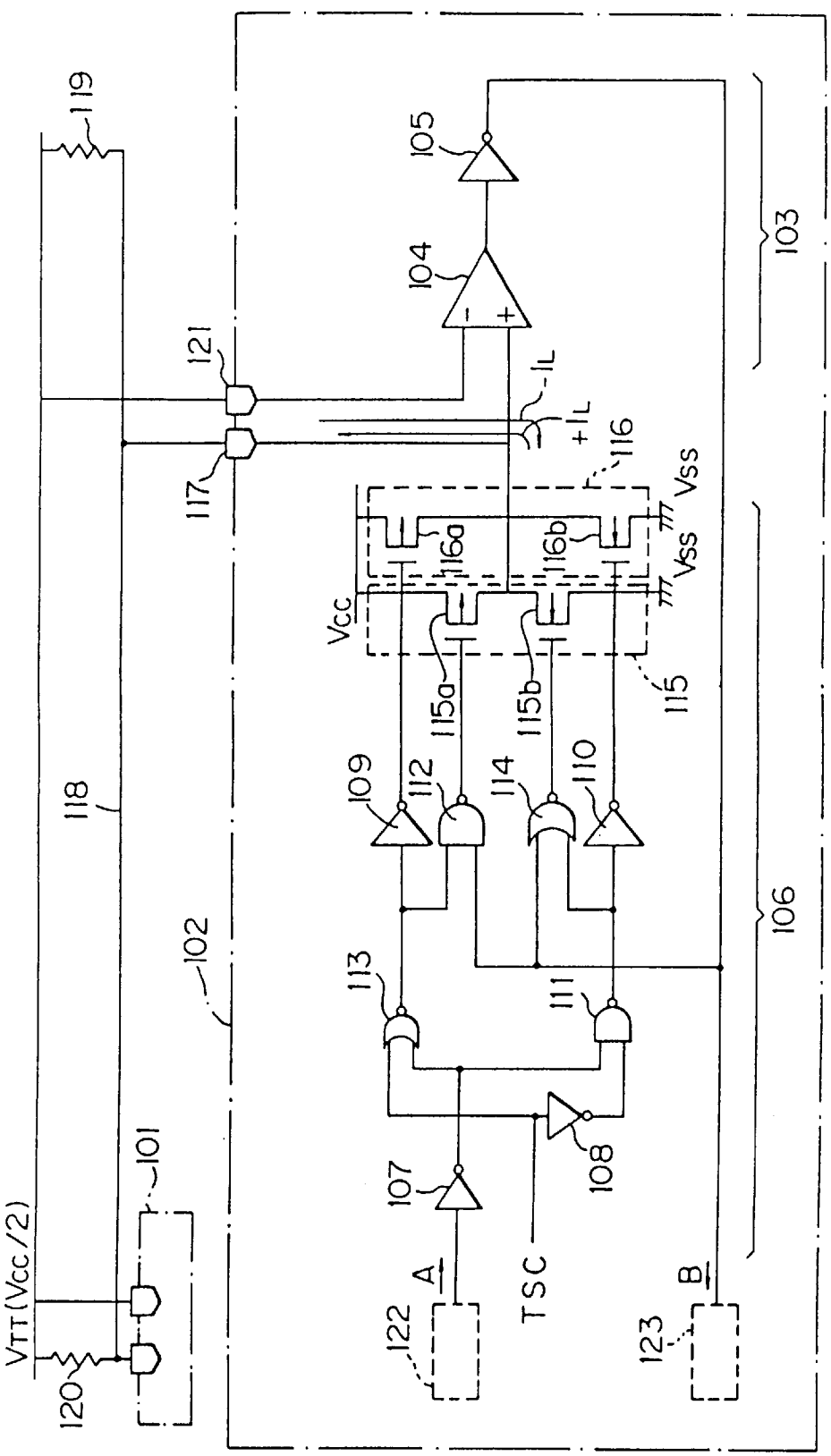
FIG. 2 is a diagram illustrating the constitution of a CTT circuit according to a second prior art.

First, for a better understanding of the preferred embodiments, the related prior art will be explained with reference to FIGS. 1 to 4.

FIG. 1 is a diagram illustrating the constitution of a conventional data transfer circuit. Here, although not specifically limited, described below is a semiconductor memory. In FIG. 1, reference numeral 1 denotes an LSI chip (hereinafter referred to as an output chip) of the side of outputting the data, and 2 denotes an LSI chip (hereinafter referred to as an input chip) of the side of inputting the data. Data D formed inside the output chip 1 is transferred to an output circuit 18 passing through an inverting passage A which consists of an inverter gate 11, a NOR gate 12, an inverter gate 13 and a transistor 14 and through a non-inverting passage B which consists of a NOR gate 15, an inverter gate 16 and a transistor 17. The output circuit 18 comprises an inverting drive unit 23 made up of transistors 19 to 22, a non-inverting drive unit 28 made up of transistors 24 to 27, and an output unit 31 made up of two transistors 29 and 30 that operate in a push-pull manner in response to the outputs from the above drive units, and opens the transistor 29 in the output unit 31 so that a data line 32 is driven with a potential $V_{cc}$ (e.g., +3.3 V) when the data D has a logic "1", i.e., the H-logic, and opens the transistor 30 in the output unit 31 so that the data line 32 is driven with a potential $V_{ss}$ (e.g., +0 V) when the data D has a logic "0", i.e., the L-logic.

Here, when an HiZ control signal is rendered to assume the L-logic, the two transistors 29 and 30 of the output unit 31 can be turned off together irrespective of the logic of the data D and, hence, the output can be opened to establish the high-impedance state. This is a function that is required when the data line 32 is to be used as a bus line.

A potential change on the data line 32, i.e., a transfer data Dt is taken in by the input chip 2 through an input terminal Pi and is transferred to a latch circuit 35 via a NOR gate 33 and a buffer circuit 34 when a predetermined control signal (e.g., a signal obtained from a write enable signal WE) has the L-logic. A buffer circuit 34 is constituted by a CMOS circuit made up of transistors 36 and 37, two transistors 38 and 39 which are turned on when a predetermined control signal (e.g., a signal obtained from a row address strobe signal RAS) has the L-logic and are turned off when the same signal has the H-logic, and an inverter gate 40. While the two transistors 38 and 39 are turned off, the latch circuit 35 is cut off from the input terminal Pi in order to prevent undesired inversion of latching caused by noise and the like.

The latch circuit 35 is constituted by a flip-flop in which four transistors 41 to 44 are connected in a crossing manner, two switching transistors 45 and 46, and an inverter gate 47, and works to set the L-logic (output=L) when the H-logic is input and works to set the H-logic (output=H) when the L-logic is input. The output of the latch circuit 35 is transmitted to each of the portions in the chip via, for example, inverter gates 48 and 49.

In the above-mentioned constitution, the logic amplitude of the transferred data Dt, i.e., the input/output level of the LSI chip is TTL (provided $V_{cc}$=+3.3 V, and $V_{ss}$=0 V), and the upper-limit frequency is around 50 MHz. In order to realize the high-speed transfer in excess of 50 MHz, it is recommended to employ, for example, the GTL system in which the output side has an open drain and $V_{OH}$ is pulled up with a resistor. In order to convert the signal of a small amplitude into an internal level (e.g., TTL or CMOS) of the input chip 2 at a high speed, a differential amplifier circuit should be provided in the initial input stage of the chip 2.

In the CTT and GTL, the signal line is terminated into a voltage lower than the power-source voltage, and a signal amplitude of smaller than 1 V is produced across the terminal resistor by a drive current of the output buffer that flows into the terminal resistor. By bringing the value of the terminal resistor to be in agreement with the characteristic impedance of the signal line, the signal is prevented from being reflected and it is made possible to transfer the data at a high speed.

[CTT Interface]

In FIG. 2, reference numerals 101 and 102 denote chips on which are mounted transceivers of the same constitution. Constitution of the transceiver mounted on the chip 102 will now be described as a representative example. Reference numeral 103 denotes an input buffer which includes a differential amplifier 104 and an inverter gate 105, and reference numeral 106 denotes an output buffer which includes inverter gates 107 to 110, NAND gates 111 and 112, NOR gates 113 and 114, as well as two stages of CMOS output units 115 and 116. The CMOS unit 115 of the preceding stage has a P-channel MOS transistor (hereinafter referred to as a second PMOS transistor) 115a and an N-channel MOS transistor (hereinafter referred to as a second NMOS transistor) 115b which are connected in a push-pull manner between the high-potential side power source $V_{cc}$ (e.g., +3 V) and the low-potential side power source $V_{ss}$ (0 V). Similarly, the CMOS unit 116 of the succeeding stage has a P-channel MOS transistor (hereinafter referred to as a first PMOS transistor) 116a and an N-channel MOS transistor (hereinafter referred to as a first NMOS transistor) 116b which are connected in a push-pull manner between the $V_{cc}$ and the $V_{ss}$. Here, reference numeral 117 denotes an input/output terminal that is connected to a signal line 118 and to the ends on one side of the terminal resistors 119, 120, reference numeral 121 denotes a reference power-source terminal connected to the ends on the other side of the terminal resistors 119, 120 and to a pull-up power source $V_{TT}$ (+1.5 V provided $V_{TT}=V_{cc}/2$, and $V_{cc}$ is +3 V), reference numeral 122 denotes any internal circuit that forms a signal (conveniently denoted here by symbol A) which is to be output to the outside of the chip via the output buffer 106, reference numeral 123 denotes any internal circuit which receives an output signal (conveniently denoted by symbol B) from the input buffer 103, and symbol TSC denotes a tri-state control signal (tri-state designation mode under the H-level condition). In the above constitution, the level of the signal B is determined by a potential relationship between the inverted input (−) and the non-inverted input (+) of the differential amplifier 104. That is, since the potential of the inverted input (−) is $V_{TT}$=+1.5 V, the signal B assumes the L-level when the potential of the non-inverted input (+) exceeds +1.5 V and assumes the H-level when the potential of the non-inverted input (+) is smaller than +1.5 V.

Now, when the signal A of the H-level is input (but the signal TSC has the L-level) under the condition where the signal B has the H-level, the outputs of the inverter gate 109, NAND gate 112, NOR gate 114 and inverter gate 110 all assume the L-level. Therefore, the PMOS transistors 115a and 116a in the two stages of CMOS units 115 and 116 are turned on, the NMOS transistors 115b and 116b are turned off, and a current $+I_L$ flows in a direction of $V_{cc}$→PMOS transistors 115a(116a)→terminal resistors 119, 120→$V_{TT}$.

Therefore, the signal B changes into the L-level at a moment when the potential of the non-inverted input (+) of the differential amplifier 104 becomes higher than the potential of the inverted input (−) by $I_L \times R_L$ ($R_L$ denotes a parallel resultant value of the terminal resistors 119 and 120, e.g., 25 Ω).

When the signal A of the L-level is input (but the signal TSC has the L-level) under the condition where the signal B has the L-level, on the other hand, the outputs of the inverter gate 109, NAND gate 112, NOR gate 114 and inverter gate 110 all assume the H-level. Therefore, the PMOS transistors 115a and 116a in the two stages of CMOS units 115 and 116 are turned off, the NMOS transistors 115b and 116b are turned on, and a current $-I_L$ flows in a direction of $V_{TT}$→NMOS transistors 115b(116b)→$V_{ss}$.

Therefore, the signal B changes into the H-level at a moment when the potential of the non-inverted input (+) of the differential amplifier 104 becomes lower than the potential of the inverted input (−) by $I_L \times R_L$.

Here, the potential at the input/output terminal 117 changes along a curve of time constant determined by the capacitance of the signal line 118, etc., and hence the signal B changes after a time that corresponds to the above time constant has passed from the change in the level of the signal A.

Therefore, when the signal A changes from L into H, the drive current $+I_L$ flows through the two PMOS transistors 115a and 116a (or, in other words, through a low resistance) until the signal B changes into the L-level. After the signal B has changed into the L-level, the drive current $+I_L$ flows through the first PMOS transistor 116a only (or, in other words, through a high resistance). The same happens even when the signal A changes from H into L. That is, the drive current $-I_L$ flows through the two NMOS transistors 115b and 116b until the signal B changes into the H-level and, then, flows through the first NMOS transistor 116b only after the signal B has changed into the H-level.

It is therefore possible to flow a large drive current in the former half period of output change, to flow a small drive current in the latter half period, to quicken the change of the output signal, and to avoid the occurrence of ringing and overshooting in the output signals.

By producing the tri-state control signal TSC of the H-level, the outputs of the inverter gate 109 and NAND gate 112 can be fixed to the H-level, and the outputs of the NOR gate 114 and the inverter gate 110 can be fixed to the L-level irrespective of the states of the signals A and B, and the four MOS transistors 115a, 115b, 116a and 116b in the two stages of CMOS units 115 and 116 can be all turned off.

[CTT/GTL Interface]

Figure 3:
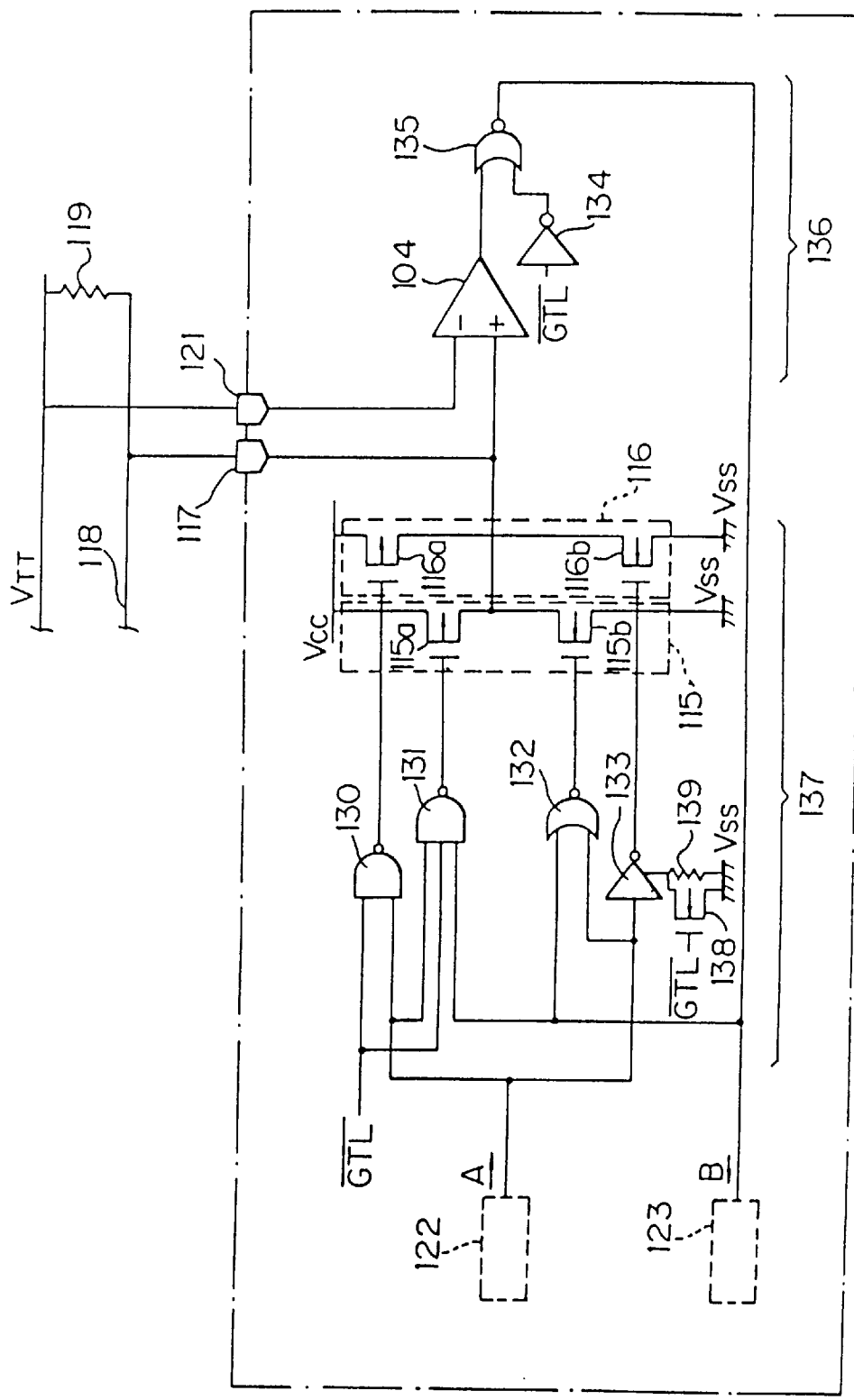
FIG. 3 is a diagram illustrating the constitution of a CTT/GTL circuit according to the second prior art.

FIG. 3 illustrates a chip mounting a transceiver for both CTT and GTL. Here, the circuit elements common to those of FIG. 2 are denoted by the same reference numerals. This transceiver operates with a CTT interface when the signal GTL is rendered to assume the H level and operates with a GTL interface when the signal GTL is rendered to assume the L level.

When the signal GTL H-level (CTT mode), the outputs of the AND gates 130, 131, NOR gate 132 and inverter gate 133 have a logic opposite to the signal A. When the signal A has the H-level, therefore, the PMOS transistors 115a and 116a are turned on and when the signal A has the L-level, the NMOS transistors 115b and 116b are turned on, and the input/output terminal 117 is driven with $V_{cc}$ or $V_{ss}$. Then, as the logic of the input/output terminal 117 is fixed to the H-level or the L-level, the logic of the signal B from the input buffer 136 which includes differential amplifier circuit 104, inverter gate 134 and NOR gate 135, becomes opposite to the logic of the input/output terminal 117, whereby the output logics of the AND gate 131 and the NOR gate 132 in the output buffer 137 are inverted causing the second PMOS transistor 115a or the second NMOS transistor 115b to be turned off.

When the signal GTL has the L-level (GTL mode), on the other hand, the output (i.e., signal B) of the NOR gate 135 of the input buffer 136 is fixed to the L-level, and the outputs of the AND gates 130 and 131 in the output buffer 137 are fixed to the H-level. Therefore, the NMOS transistors 115b and 116b only are turned on or off depending upon the state of the signal A, and the output buffer 137 operates with its drain open.

An NMOS transistor 138 and a resistor 139 added to the inverter gate 133 of the output buffer 137 are to retard the cut-off of the first NMOS transistor 116b in the GTL mode in order to avoid a sudden snap-off of the output signal.

The first prior art (FIG. 1) in which the pull-up resistor is connected to the data line 32 and the differential amplifier circuit is provided in the initial input stage of the chip 2, was effective for transferring the data at high speeds in excess of 50 MHz but was not suited for the applications where importance is given to the electric power efficiency rather than to the high-speed operation.

In the case of, for example, a note-type personal computer and EWS which are powered on a battery, efforts have been made to use the battery as long as possible by decreasing the speed of clocks of the CPU (i.e., by decreasing the frequency of the transferred data) resulting, however, in the wasteful consumption of electric power by the pull-up resistor and by the differential amplifier. Besides, since the numbers of pull-up resistors and differential amplifiers vary in proportion to the number of bits of the transferred data, the electric power as a whole is consumed to a degree which is no more negligible.

Figure 4:
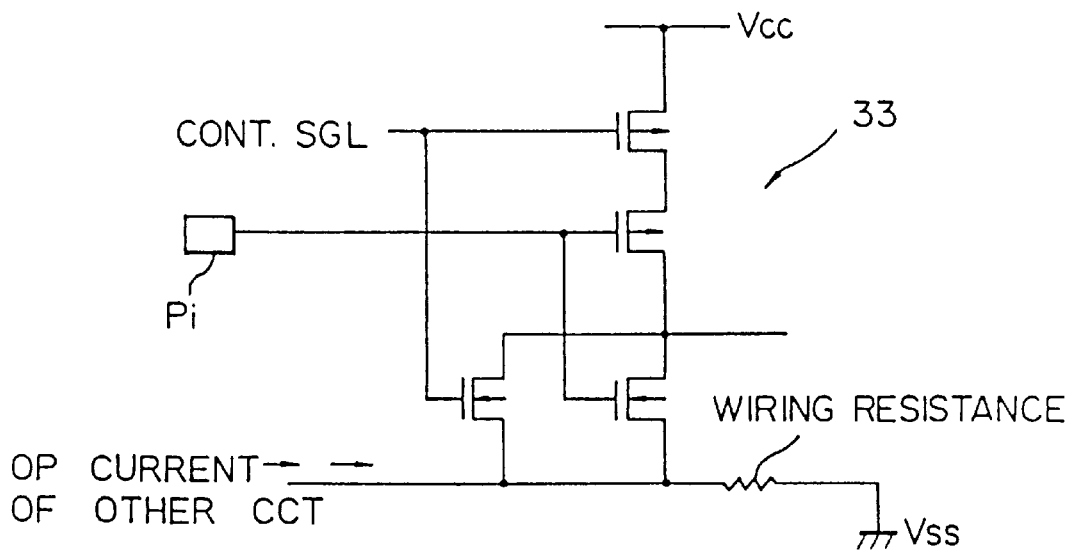
FIG. 4 is a diagram illustrating the constitution of a NOR gate which is arranged in the first stage in the input chip of FIG. 1.

According to the first prior art in which the transferred data are input to the NOR gate 33, furthermore, the "threshold value" of the NOR gate for discriminating the high or low level of the input voltage is subject to change being affected by the fabrication conditions or due to the ground potential that floats being caused by a current during the operation (see the constitution of NOR gate 33 in FIG. 4).

The second prior art (FIG. 2 or 3) could be adapted to the signal interface of a very small amplitude (several hundreds of mV) such as of CTT or GTL. When the second prior art was adapted to the signal interface (e.g., CMOS or TTL) of a large amplitude in excess of 1 V, however, such problems aroused as large distortion in the output signal or delay in the change of the output signal.

By removing the terminal resistors 119 and 120 from FIG. 2 or 3, the logic amplitude on the signal line 118 can be increased nearly to the full amplitude of the power source so as to be used for the signal interface of large amplitude accompanied, however, by the following inconvenience.

If the logic amplitude on the signal line 118 is 0.4 V, then the internal resistance (on resistance $R_{ON}$) of the first PMOS transistor 116a and the first NMOS transistor 116b that governs the CTT level or the GTL level can be found from the following equation (1), $$0.4/(1.5-0.4)=25/R_{ON} \quad (1)$$

where 1.5 represents the potential ($V_{cc}/2$) of $V_{TT}$ and 25 represents the parallel resultant value of the terminal resistors 119 and 120.

From the above equation (1), $R_{ON}$ becomes 68.75 ohms. In order to obtain this internal resistance, the sizes of the first PMOS transistor 116a and the first NMOS transistor 116b must be approximately so set that "gate length L=1 μm and gate width W=100 μm". However, this size is considerably smaller than the size of the general CMOS output transistors (e.g., L=100 μm, W=1000 μm), and the driving power is apparently insufficient when it is used as an output transistor of the CMOS level or the TTL level.

Since the driving power is so small, therefore, it is not possible to suppress the wave reflected by the inductance component of the signal line, and to eliminate distortion in the output signal. Accordingly, it is not allowed, either, to quickly charge or discharge a large capacitive load (about 100 PF) of the TTL level. Accordingly, the change of the output signal becomes loose, and changing time is lengthened.

Figure 5:
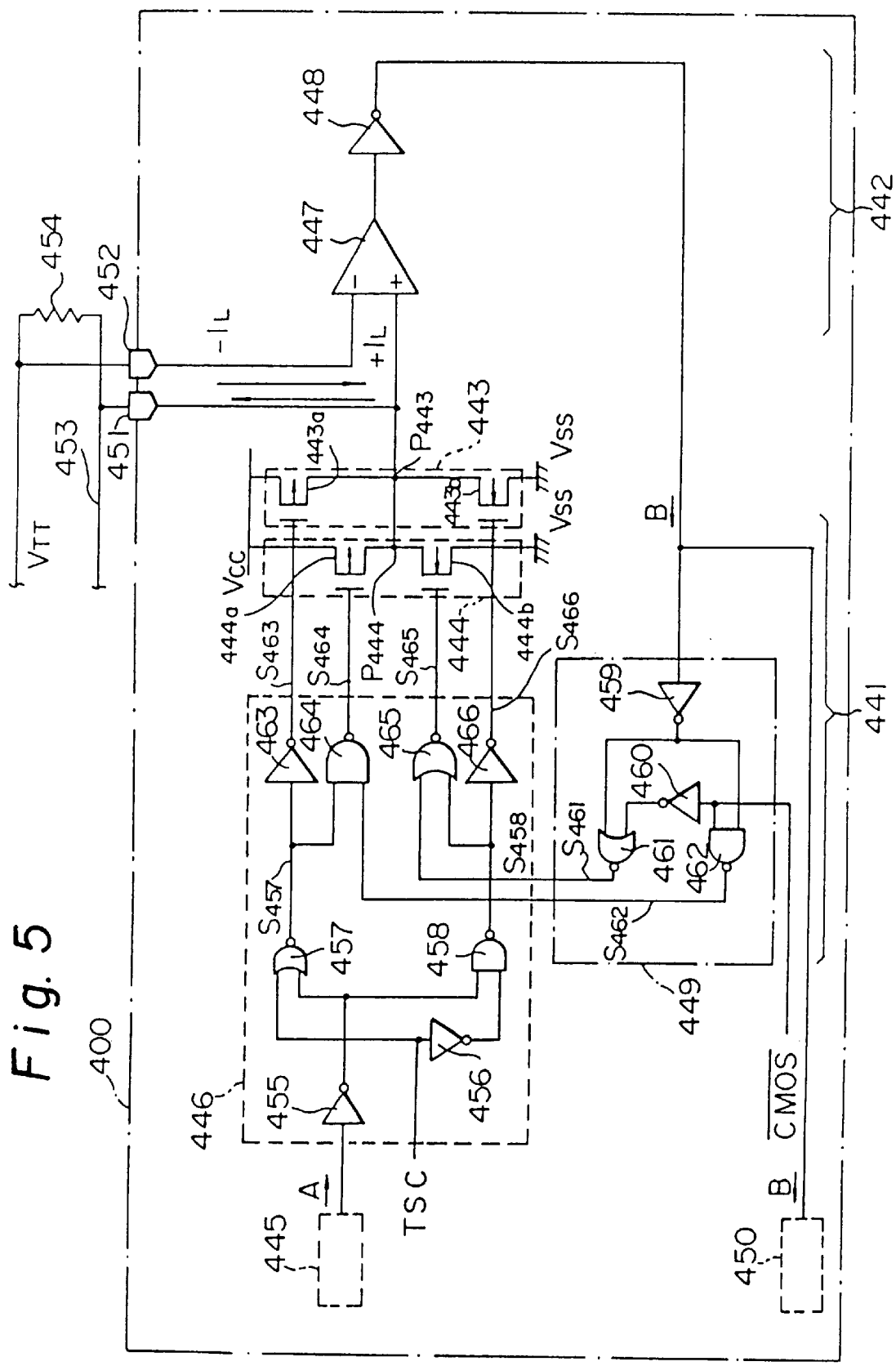
FIG. 5 is a diagram illustrating the constitution of a first embodiment of the first aspect of the present invention.
Figure 6:
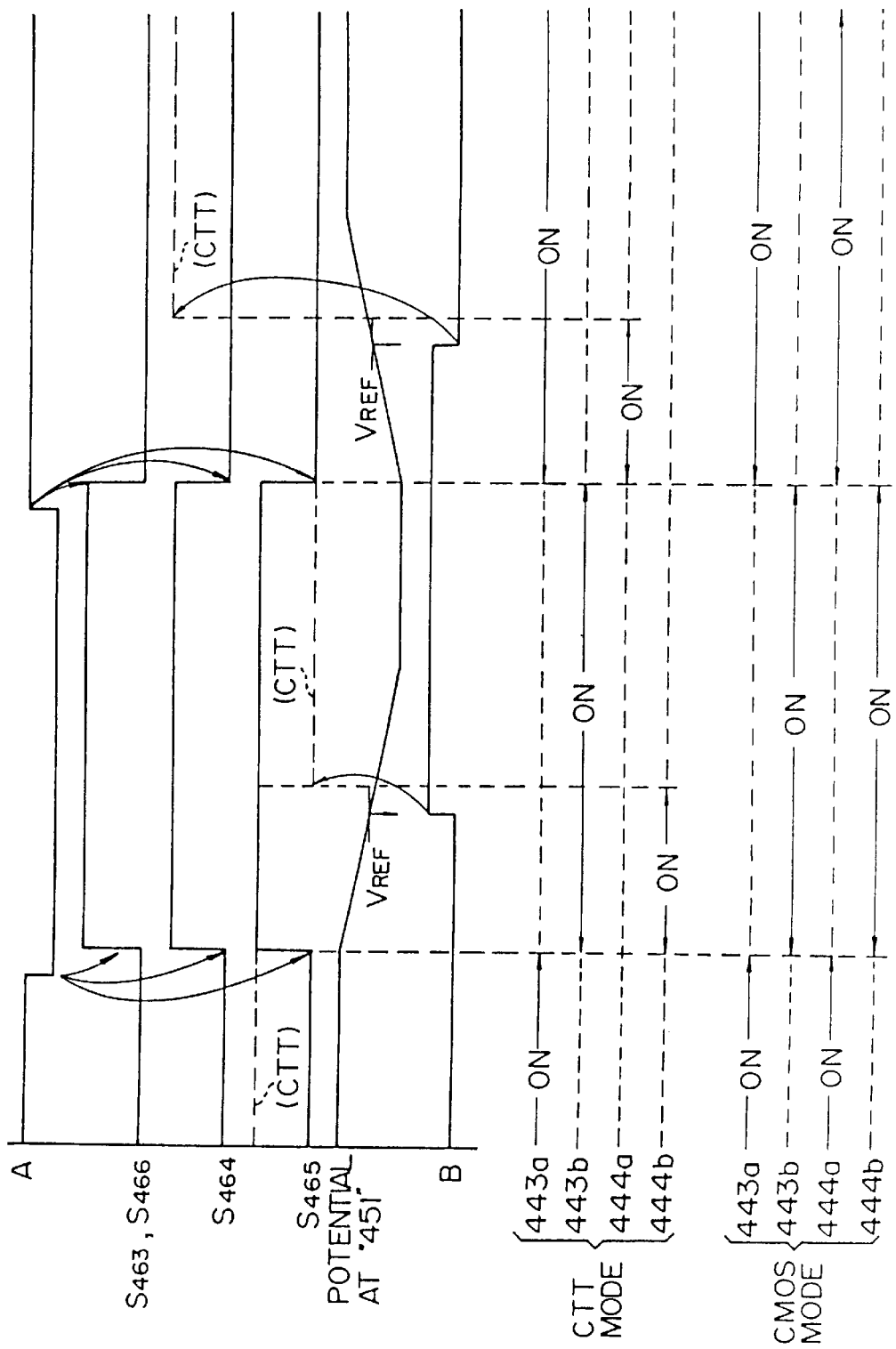
FIG. 6 is a time chart of the first embodiment of the first aspect of the present invention.
Figure 7:
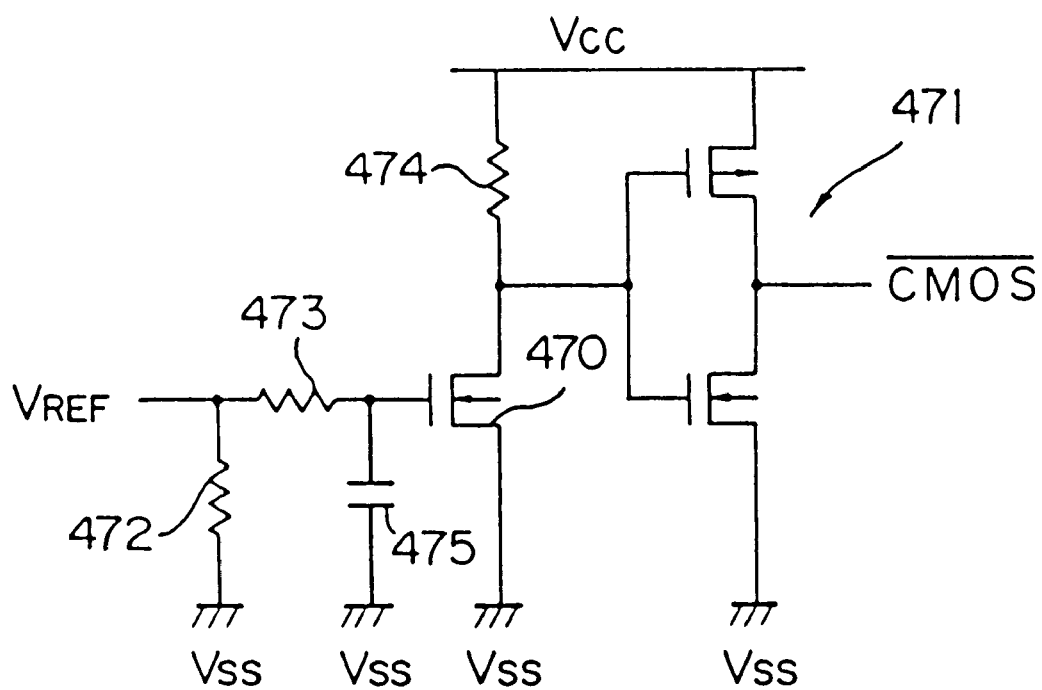
FIG. 7 is a diagram of a circuit for automatically forming a mode designation signal CMOS in the first aspect of the present invention.

FIGS. 5 to 7 are diagrams illustrating a first embodiment of a semiconductor integrated circuit according to the present invention, which can be used for both the CTT and the CMOS.

The constitution will be described, first. In FIG. 5, reference numeral 440 denotes a chip of the semiconductor integrated circuit on which is mounted a transceiver circuit made up of an output buffer 441 and an input buffer 442. The output buffer 441 comprises a first CMOS unit 443 consisting of a first PMOS transistor 443a and a first NMOS transistor 443b connected in series between the high-potential side power source $V_{cc}$ and the low-potential side power source $V_{ss}$, a second CMOS unit 444 consisting of a second PMOS transistor 444a and a second NMOS transistor 444b connected in series between $V_{cc}$ and $V_{ss}$, an on/off control means 446 which controls the on/off operation of these four MOS transistors 443a, 443b, 444a and 444b based on a signal (conveniently denoted by A) from a circuit 445 in the chip and a tri-state control signal (signal which, when it has the H-level, designates a high output impedance) TSC, and a mode control means 449 which switches the operation modes of said first CMOS unit 443 and said second CMOS unit 444 based on a predetermined mode designation signal (signal which, when it has the L-level, designates the CMOS transfer mode) $\overline{\text{CMOS}}$ and a signal (conveniently denoted by B) from the input buffer 442 that includes a differential amplifier unit 447 and an inverter gate 448. Reference numeral 450 denotes a circuit in the chip which receives a signal B from the input buffer 442, reference numeral 451 denotes an input/output terminal, and 452 denotes a reference voltage terminal. The input/output terminal 451 is connected to both a point P443 at which the first PMOS transistor 443a and the first NMOS transistor 443b are connected together and a point 444 at which the second PMOS transistor 444a and the second NMOS transistor 444b are connected together, and is further connected to a signal line 453 on the outside of the chip 440. When the chip 440 is used in the transfer mode (first transfer mode) of the CTT level, the input/output terminal 451 is served, via the terminal resistor 454 (the resistance is 25Ω with two terminal resistors), with the predetermined constant voltage $V_{TT}$ ($V_{TT}=V_{cc}/2$, i.e., +1.5 V when $V_{cc}$ is +3 V) which is further applied to the reference voltage terminal 452.

[CTT Operation]

In the above constitution, the level of the signal B is determined by a potential relation between the inverted input (−) and the non-inverted input (+) of the differential amplifier unit 447. That is, since the potential of the inverted input (−) is $V_{TT}$=+1.5 V, the output (signal B) of the inverter gate 448 assumes the L-level when the potential of the non-inverted input (+) exceeds +1.5 V or, in other words, when the logic at the input/output terminal 451 is fixed to the H-level, and the signal B assumes the H-level when the potential becomes smaller than +1.5 V or, in other words, when the logic at the input/output terminal 451 is fixed to the L-level.

If now the signal A changes from the L-level into the H-level (but the signal TSC remains at the L-level), the output of the inverter gate 455 in the on/off control means 446 assumes the L-level and the output of the inverter gate 456 assumes the H-level. Therefore, the output S457 of the NOR gate 457 and the output S458 of the AND gate 458 both assume the H-level. Immediately after the signal A has changed from L into H, the signal B has the H-level (since the input/output terminal 451 has the L-level) and, besides, the signal CMOS has the H-level during the CTT operation. Therefore, outputs of the inverter gates 459 and 460 in the mode control means 449 both assume the L-level. Accordingly, the NOR gate 461 and the NAND gate 462 simply operate as inverter gates and their outputs S461 and S462 both assume the H-level like the signal B.

Accordingly, the output S463 of the inverter gate 463 in the on/off control means 446, the output S464 of the NAND gate 464, the output S465 of the NOR gate 465, and the output S466 of the inverter gate 466 all assume the L-level. Therefore, the first PMOS transistor 443a and the second PMOS transistor 444a in the two stages of CMOS units 443 and 444 are both turned on, and the first NMOS transistor 443b and the second NMOS transistor 444b in the CMOS units 443 and 444 are both turned off, permitting a current $+I_L$ to flow in the direction of "$V_{cc}$→first PMOS transistor 443a and second PMOS transistor 444a→terminal resistor 454→$V_{TT}$". As the signal B is inverted into the L-level at a moment when the potential of the non-inverted input (+) of the differential amplifier unit 447 becomes higher than the potential of the inverted input (−) by $I_L \times R_L$ ($R_L$ denotes the value of the terminal resistor 454, e.g., 25 Ω), i.e., at a moment when the logic (H-level of CTT) is fixed at the input/output terminal 451, than, both the two outputs S461 and S462 from the mode control means 449 change into the L-level, and the output S464 of the AND gate 464 in the on/off control means 446 assumes the H-level. After the logic of the input/output terminal 451 is fixed, therefor, the drive current $+I_L$ is supplied by the first PMOS transistor 443a only.

As the signal A changes from the H-level into the L-level (but the signal TSC remains at the L-level), on the other hand, the output of the inverter gate 455 of the on/off control means 446 assumes the H-level, and both the output S457 of the NOR gate 457 and the output S458 of the AND gate 458 assume the L-level. Immediately after the signal A has changed from H into L, the signal B has the L-level. Therefore, the output of the inverter gate 459 of the mode control means 449 assumes the H-level, and both the output S461 of the NOR gate 461 and the output S462 of the NAND gate 462 assume the L-level.

Therefore, the output S463 of the inverter gate 463 in the on/off control means 446, the output S464 of the NAND gate 464, the output S465 of the NOR gate 465, and the output S466 of the inverter gate 466 all assume the H-level. Contrary to the above-mentioned case, therefore, the first PMOS transistor 443a and the second PMOS transistor 444a in the CMOS units 443 and 444 are both turned off, and the first NMOS transistor 443b and the second NMOS transistor 444b in the CMOS units 443 and 444 are both turned on, permitting the current $-I_L$ to flow in the direction of "$V_{TT}$→terminal resistor 454→first NMOS transistor 443b and second NMOS transistor 444b→$V_{ss}$". As the signal B is inverted into the H-level at a moment when the potential of the non-inverted input (+) of the differential amplifier unit 447 becomes lower than the potential of the inverted input (−) by $I_L \times R_L$, i.e., at a moment when the logic (L-level of CTT) is fixed at input/output terminal 451, then both the two outputs S461 and S462 from the mode control means 449 change into the H-level, and the output S465 of the NOR gate 465 in the on/off control means 446 assumes the L-level. After the logic of the input/output terminal 451 is fixed, therefore, the drive current $-I_L$ is supplied by the first NMOS transistor 443b only. [CMOS Operation]

If the mode designation signal CMOS bar (hereinafter, bar is omitted) is set to the L-level, it is allowed to use the semiconductor integrated circuit 440 on the CMOS level. In this case, the terminal resistor 454 is removed from between the signal line 453 and $V_{TT}$.

As the signal CMOS is set to the L-level, the output S461 of the mode control means 449 is fixed to the L-level and the output S462 is fixed to the H-level irrespective of the logic of the signal B. Accordingly, NAND gate 464 and the NOR gate 465 in the on/off control means 446 simply work as inverter gates and, hence, the two stages of CMOS units 443 and 444 perform on/off operations in parallel in response to the logic of the signal A.

When the signal A changes, for example, from the L-level into the H-level (but the signal TSC remains at the L-level), the four outputs (S463, S464, S465, and S466) of the on/off control means 446 all assume the L-level since S457 and S458 both have the H-level, and the first PMOS transistor 443a and the second PMOS transistor 444a in the two stages of CMOS units 443 and 444 are both turned on. The period in which these two PMOS transistors 443a and 444a are turned on is in agreement with the period in which the signal A assumes the H-level.

During the period in which the signal A has the H-level, therefore, the output terminal 451 is double-driven by the two PMOS transistors 443a and 444a. The same holds even when the signal A has changed into the L-level. In this case, the first NMOS transistor 443b and the second NMOS transistor 444b in the two stages of CMOS units 443 and 444 are both turned on.

During the period in which the signal A has the L-level, therefore, the output terminal 451 is double-driven by the two NMOS transistors 443b and 444b.

FIG. 6 is a time chart for comparing the CTT mode with the CMOS mode. In the CTT mode, the logics of the signals S464, S465, S463 and S466 are in agreement immediately after the signal A has changed until the logic of the signal B is inverted.

In the CTT mode, therefore, the two PMOS transistors 443a and 444a or the two NMOS transistors 443b and 444b are turned on in parallel only during a period of immediately after the signal A has changed until the logic of the signal B is inverted. After this period, the first PMOS transistor 443a only or the first NMOS transistor 444a only is turned on. The amplitude of the signal appearing at the output terminal 451 (i.e., on the signal line 453) is determined by the resistance $R_{ON}$ of the first PMOS transistor 443a or the first NMOS transistor 444a of when it is turned on, the resistance $R_L$ of the terminal resistor 454 and the terminal voltage $V_{TT}$. When, for instance, the signal amplitude is 0.4 V, $V_{TT}$ is 1.5 V, and $R_L$ is 25 Ω, then $R_{ON}$ becomes 68.75 Ω from the above equation (1). To satisfy this value $R_{ON}$, the size of the first PMOS transistor 443a or the first NMOS transistor 444a should be set to be about "L=1 μm and W=200 μm".

In the CMOS mode, on the other hand, the logics of the signals S464, S465, S463 and S466 are always in agreement and, besides, the terminal resistor 454 is removed. Accordingly, the amplitude of the signal appearing at the output terminal 451 is determined by the resistances of the two parallel PMOS transistors 443a, 444a or the two parallel NMOS transistors 443b, 444b of when they are turned on. By setting the on-resistance of the first PMOS transistor 443a and the first NMOS transistor 443b to be about 68.75 Ω and by setting the on-resistance of the second PMOS transistor 444a and the second NMOS transistor 444b to be as small as possible, therefore, it is allowed to sufficiently decrease the parallel on-resistance and hence to maintain a driving power necessary for the CMOS level.

If the size of the second PMOS transistor 444a and the second NMOS transistor 444b is set to be nearly that of a general CMOS output transistor (e.g., L=1 μm, W=1000 μm), a sufficiently large driving power is obtained from the second PMOS transistor 444a and the second NMOS transistor 444b only, in principle. However, the present invention is in no way limited to the one in which the two MOS transistors are driven in parallel, but may be the one in which the internal resistances of the first PMOS transistor 443a and the first NMOS transistor 443b are set to values suited for the CTT level and the internal resistances of the second PMOS transistor 444a and the second NMOS transistor 444b are set to values suited for the MOS level, so that these two sets of MOS transistors can be used depending upon the CTT level and the CMOS level. The driving power can be further increased if the two sets of transistors are driven in parallel, as a matter of course. Therefore, it is quite natural to employ the above driving method for the CMOS mode.

It is desired that the mode designation signal CMOS is automatically formed by a circuit that is shown in FIG. 7. This circuit monitors the potential (reference potential $V_{REF}$) at the reference potential terminal 452 (see FIG. 5) of the chip 440, and turns the NMOS transistor 470 on so that the output (signal CMOS) of the CMOS inverter gate 471 assumes the H-level when the potential is higher than a threshold voltage of the NMOS transistor 470, i.e., when the terminal voltage $V_{TT}$ (=+1.5 V) of CTT is applied to the reference voltage terminal 452, and further turns the NMOS transistor 470 off so that the output (signal CMOS) of the CMOS inverter gate 471 assumes the L-level when the reference voltage terminal 452 is in an open state or has the ground level, i.e., when the terminal voltage $V_{TT}$ of CTT is not applied thereto. Reference numerals 472 to 474 denote resistors, and 457 denote a capacitor. The resistor 472 works to apply the ground level to the gate of NMOS transistor 470 when the reference terminal 452 is opened, and the resistor 473 serves as a load element for the NMOS transistor 470. The resistor 472 and the capacitor 475 constitute an integration circuit which cuts the input noise and prevents erroneous operation of the NMOS transistor 470.

The above circuit enables the CTT mode or the CMOS mode to be used being automatically switched depending upon the potential of the reference voltage terminal 452, i.e., enables the semiconductor integrated circuit to be conveniently used.

FIGS. 8 to 13 are diagrams illustrating a semiconductor integrated circuit according to an embodiment of the present invention.

This embodiment is to eliminate the defect of the circuit (see FIG. 7) for automatically forming the mode designation signal of the above-mentioned embodiment.

That is, the circuit of FIG. 7 of the above-mentioned embodiment determines the logic of the mode designation signal (signal CMOS) by comparing the reference potential $V_{REF}$ with the "threshold voltage" of the NMOS transistor 470. Generally, however, variation is inevitably involved in the threshold voltage of the transistor due to error in the step of fabrication, and much room is left for improving the stability of operation.

Figure 8:
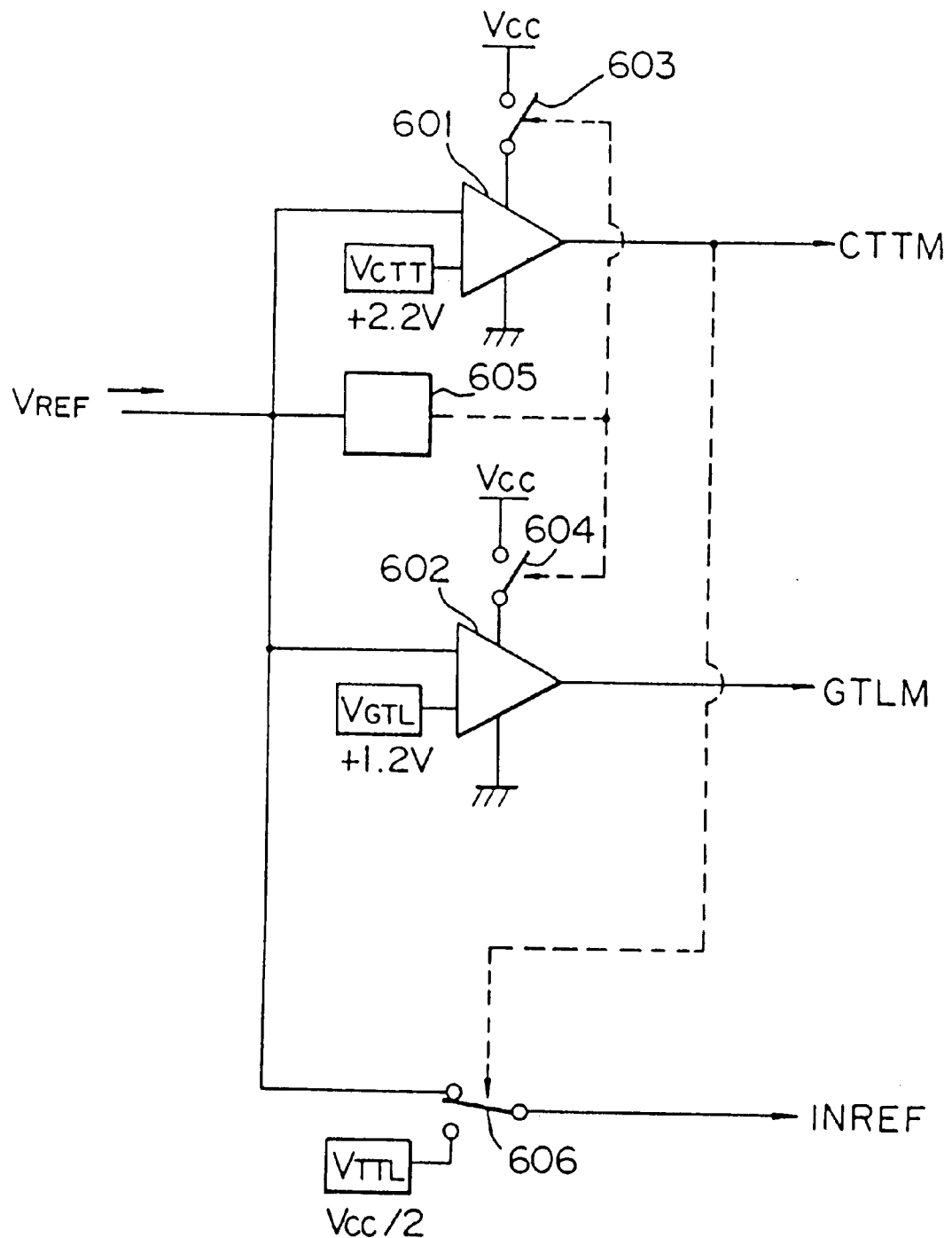
FIG. 8 is a diagram illustrating the principle and constitution of an aspect of the present invention.

FIG. 8 is a diagram illustrating the principle and constitution of this embodiment, wherein reference numerals 601 and 602 denote comparators or differential means. Hereinafter, the comparator 601 is called first comparator, and the comparator 602 is called second comparator. The first comparator 601 compares the reference voltage $V_{REF}$ with a constant voltage $V_{CTT}$, and outputs a signal CTTM of a predetermined logic (high level) when $V_{REF}>V_{CTT}$. The second comparator 602 compares the reference voltage $V_{REF}$ with a constant voltage $V_{GTL}$, and outputs a signal GTLM of a predetermined logic (high level) when $V_{REF}>V_{GTL}$. Here, the constant voltage $V_{CTT}$ has a potential which is greater than a value ($V_{cc}/2$=+1.65 V or +1.5 V) of the reference voltage $V_{REF}$ in the CTT mode, and the constant voltage $V_{GTL}$ has a potential which is greater than a value (+0.8 V) of the reference voltage $V_{REF}$ in the GTL mode. Desirably, for instance, $V_{CTT}$=+2.2 V and $V_{GTL}$=+1.2 V.

Table 1 shows the reference voltage $V_{REF}$ and the mode designation signals (CTTM, GTLM).

TABLE 1

| Range of comparison | Mode designation signal | | Mode |
| --- | --- | --- | --- |
| | CTTM | GTLM | |
| $V_{REF}$ < +1.2 V | low level | low level | GTL |
| +1.2 V < $V_{REF}$ > +2.2 V | low level | high level | CTT |
| +2.2 V < $V_{REF}$ > $V_{cc}$ (or open) | high level | high level | TTL |

Thus, the operation for discriminating the three modes is stabilized relying upon the precision of the two constant voltages $V_{CTT}$ and $V_{GTL}$, and the constant voltages $V_{CTT}$ and $V_{GTL}$ are precisely formed by, for example, dividing voltage using resistors. There is thus realized a circuit for automatically forming mode designation signals suited for the interfaces for practically all of CTT, GTL and TTL.

This embodiment is further provided with switching elements 603 and 604 capable of interrupting the power source current for the first and second comparators 601, 602, and with a control means 605 which turns the switching elements 603, 604 off when the reference voltage $V_{REF}$ is $V_{cc}$ (or open), i.e., in the TTL mode, so that no electric power is consumed by the first and second comparators 601, 602 in the TTL mode.

Moreover, this embodiment is provided with a switching element (or selection means) 606 which selects either the reference voltage $V_{REF}$ or the constant voltage $V_{TTL}$ according to the logic of the signal CTTM (i.e. instruction means) to use it as a reference voltage INREF (e.g., $V_{REF}$) of the input buffer circuit. When the signal CTTM has the low level, i.e., in the CTT mode or in the GTL mode, there holds a relation INREF=$V_{REF}$ and when the signal CTTM has the high level, i.e., in the TTL mode, there holds a relation INREF=$V_{TTL}$. Desirably, $V_{TTL}$ should be $V_{cc}/2$. In this case, the reference voltage INREF of a magnitude suited for each of the modes is automatically generated and is fed to the input buffer circuit.

Figure 9:
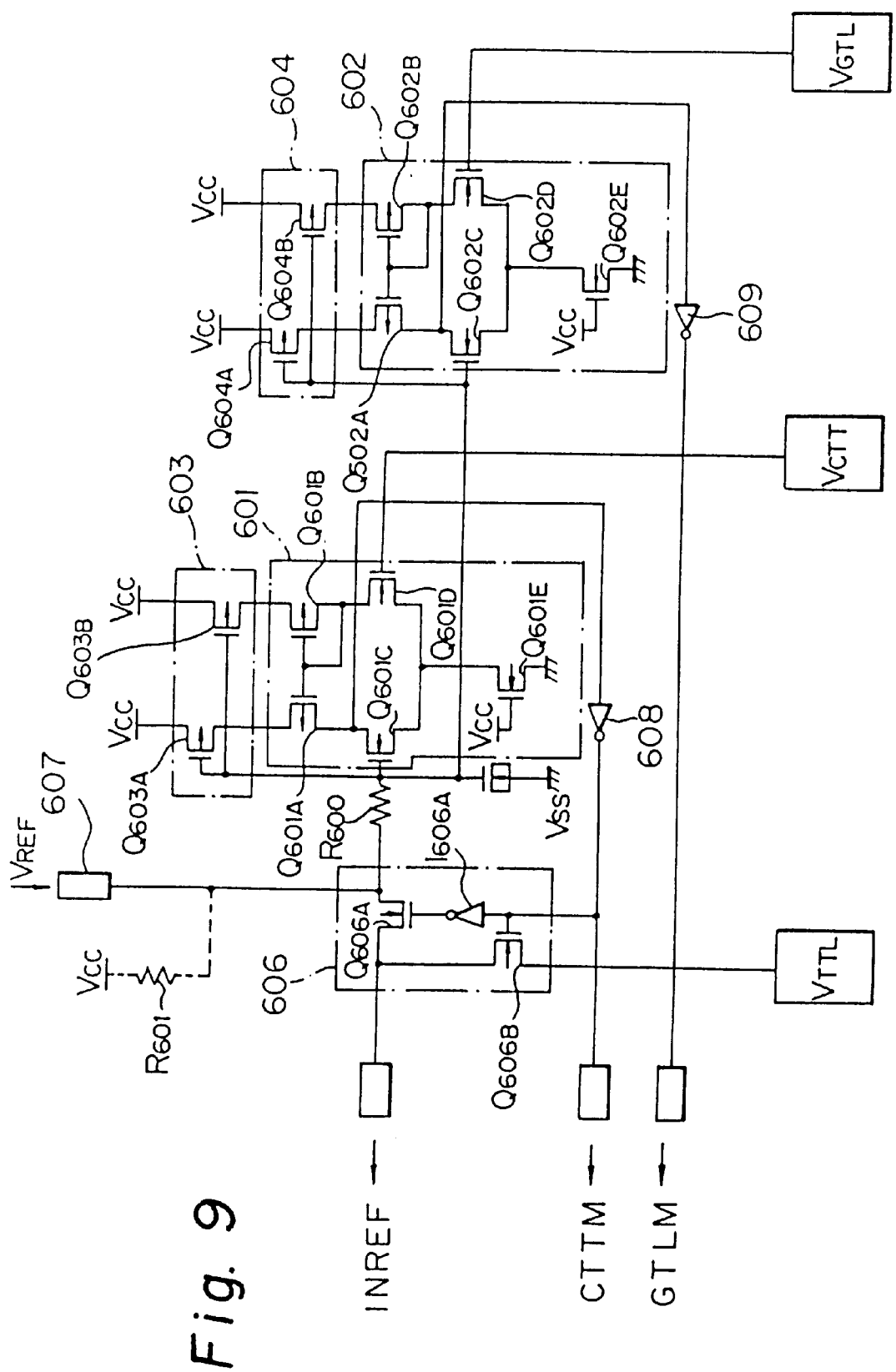
FIG. 9 is a diagram illustrating the constitution of a mode judging circuit.

FIG. 9 is a diagram which concretely illustrates the constitution of a circuit for automatically forming a mode designation signal. In FIG. 9, the same functional portions as those of FIG. 8 are denoted by the same reference numerals. That is, the first and second comparators 601 and 602 are each constituted by a pair of NMOS transistors Q601C and Q601D using PMOS transistors Q601A and Q601B as load elements, a pair of NMOS transistors Q602C and Q602D using PMOS transistors Q602A and Q602B as load elements, and constant-current sources made up of NMOS transistors Q601E, Q602E. Further, the switching elements 603 and 604 each have two PMOS transistors Q603A, Q603B and Q604A, Q604B.

The gates of the transistors in the above two switching elements 603 and 604 are served with a potential from a reference voltage terminal 607 of the chip via the resistor R600. When the reference voltage $V_{REF}$ (+0.8 V, +1.65 V or +1.5 V) is applied from outside the chip (CTT or GTL mode), this potential becomes low to correspond to $V_{REF}$. When the reference voltage is not applied (TTL mode), this potential is fixed to a high value being pulled up to $V_{cc}$.

Therefore, the two switching elements 603 and 604 are turned on in the GTL or CTT mode to permit the supply of power source current to the first and second comparators 601, 602, but inhibit (cut off) the supply of current in the TTL mode, so that no electric power is consumed by the first and second comparators 601, 602.

The first comparator 601 compares the potential at the reference voltage terminal 607 with the constant voltage $V_{CTT}$ and renders the output (signal CTTM) of the inverter gate 608 to assume the high level when $V_{CTT}$ is lower. The second comparator 602 compares the potential at the reference voltage terminal 607 with the constant voltage $V_{GTL}$ and renders the output (signal GTLM) of the inverter gate 609 to assume the high level when $V_{GTL}$ is lower.

The signal CTTM is input to a switching element 606 which consists of two NMOS transistors Q606A and Q606B, and an inverter gate I606A. Depending on the logic condition of the signal CTTM, the switching element 606 selects either the potential at the reference voltage terminal 607 or the constant voltage $V_{TTL}$ and outputs it as the reference voltage INREF for the input buffer circuit. That is, when the signal CTTM has the low level (GTL or CTT mode), Q606A is turned on and the potential at the reference voltage terminal 607 becomes INREF. When the signal CTTM has the high level (TTL mode), on the other hand, Q606B is turned on and the constant voltage $V_{TTL}$ becomes INREF.

Figure 10:
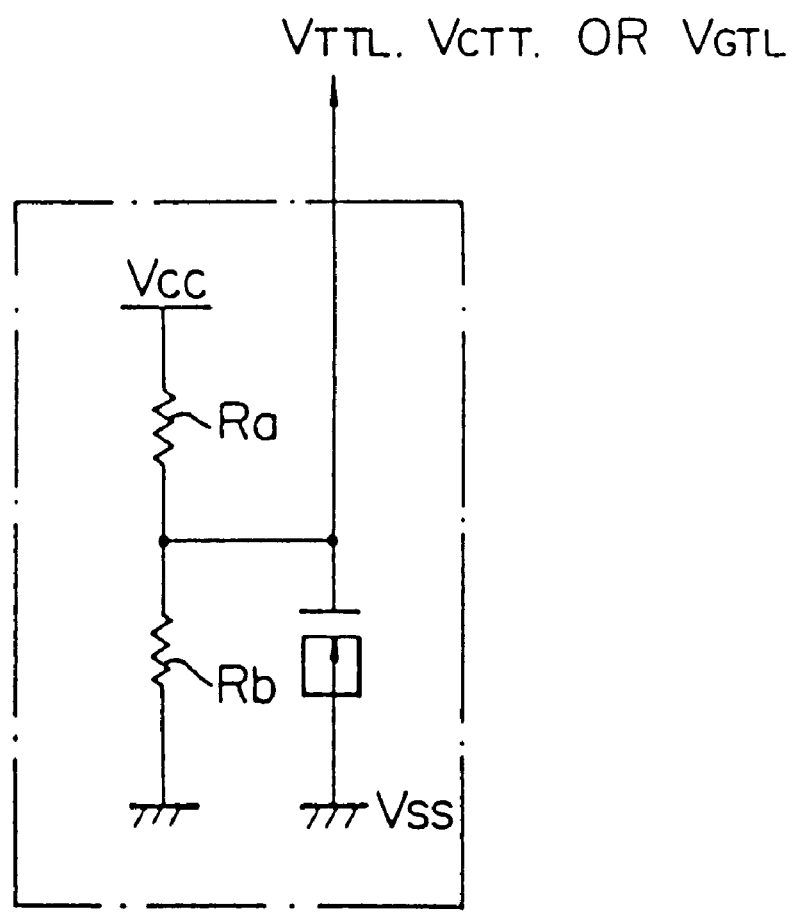
FIG. 10 is a diagram illustrating the constitution of a constant voltage-generating circuit.

FIG. 10 shows a circuit for generating the constant voltage $V_{TTL}$, $V_{CTT}$ or $V_{GTL}$, and in which the voltage between the high-potential power source $V_{cc}$ and the low-potential power source $V_{ss}$ is divided by resistors Ra and Rb, in order to obtain a constant voltage of a magnitude that corresponds to the voltage-dividing ratio.

Figure 11:
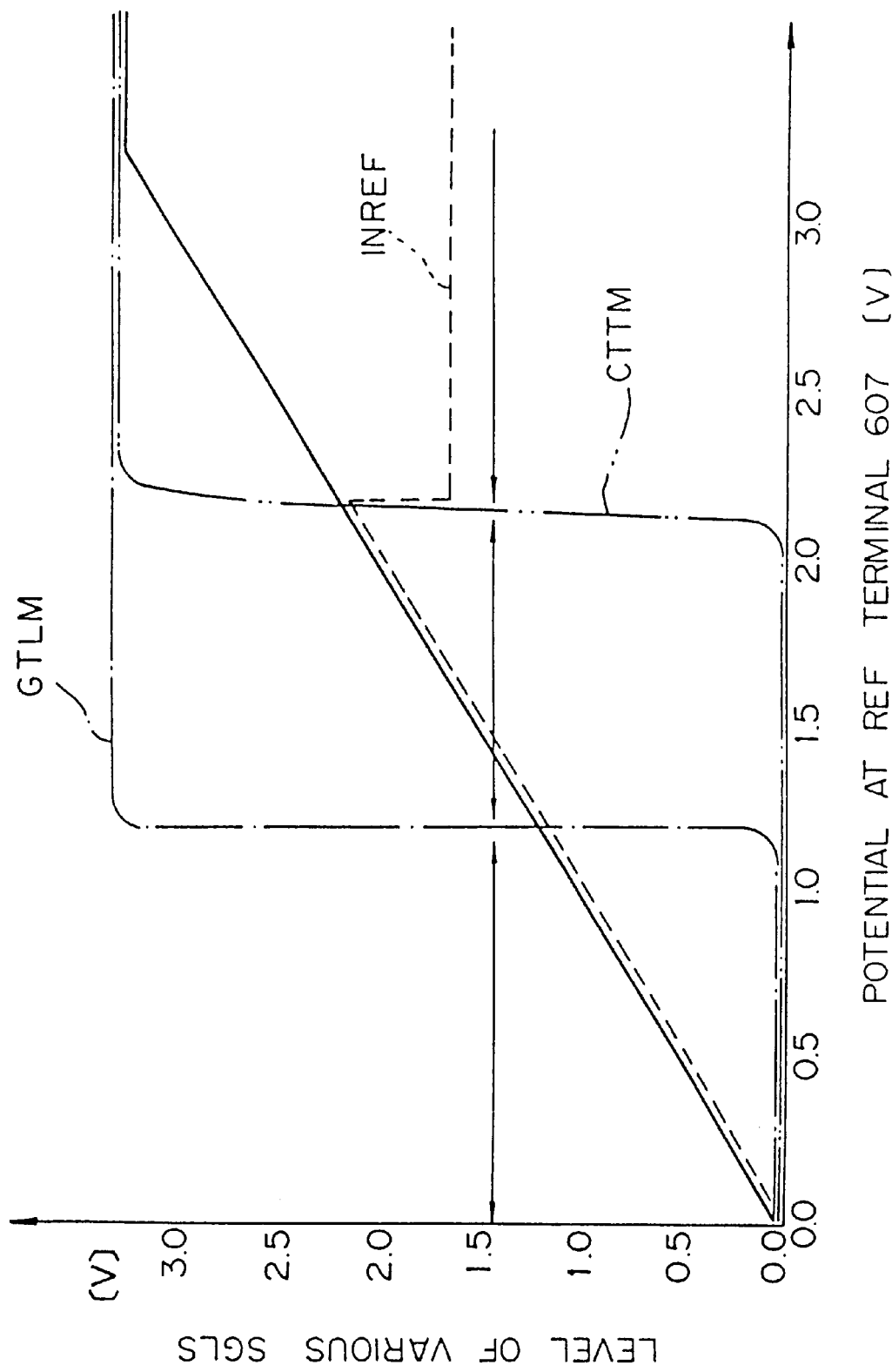
FIG. 11 is a diagram of a waveform of an output signal of the mode judging circuit.

FIG. 11 is a graph showing changes in the levels of signals (GTLM, CTTM, INREF) in response to a change in the potential at the reference voltage terminal 607. Now, the potential of the reference voltage terminal 607 is changed from 0 V to $V_{cc}$ (+3.3 V). In a region "a" of from 0 V to $V_{GTL}$ ($V_{GTL}$=+1.2 V), both the signal GTLM and the signal CTTM have the low level. In a region "b" of from $V_{GTL}$ to $V_{CTT}$ ($V_{CTT}$=+2.2 V), the signal GTLM only assumes the high level and in a region "c" of from $V_{CTT}$ to $V_{cc}$, the signal CTTM, too, assumes the high level. Moreover, INREF is in agreement with the potential at the reference voltage terminal 607 between the regions "a" and "b", and is fixed to $V_{TTL}$ in the region "c".

Therefore, the potential of the reference voltage terminal 607 is +0.8 V in the GTL mode, +1.65 V (or +1.5 V) in the CTT mode or $V_{cc}$ in the TTL mode. These potentials can be classified in their respective regions and can be displayed as combinations of the two mode designation signals GTLM and CTTM.

Figure 12:
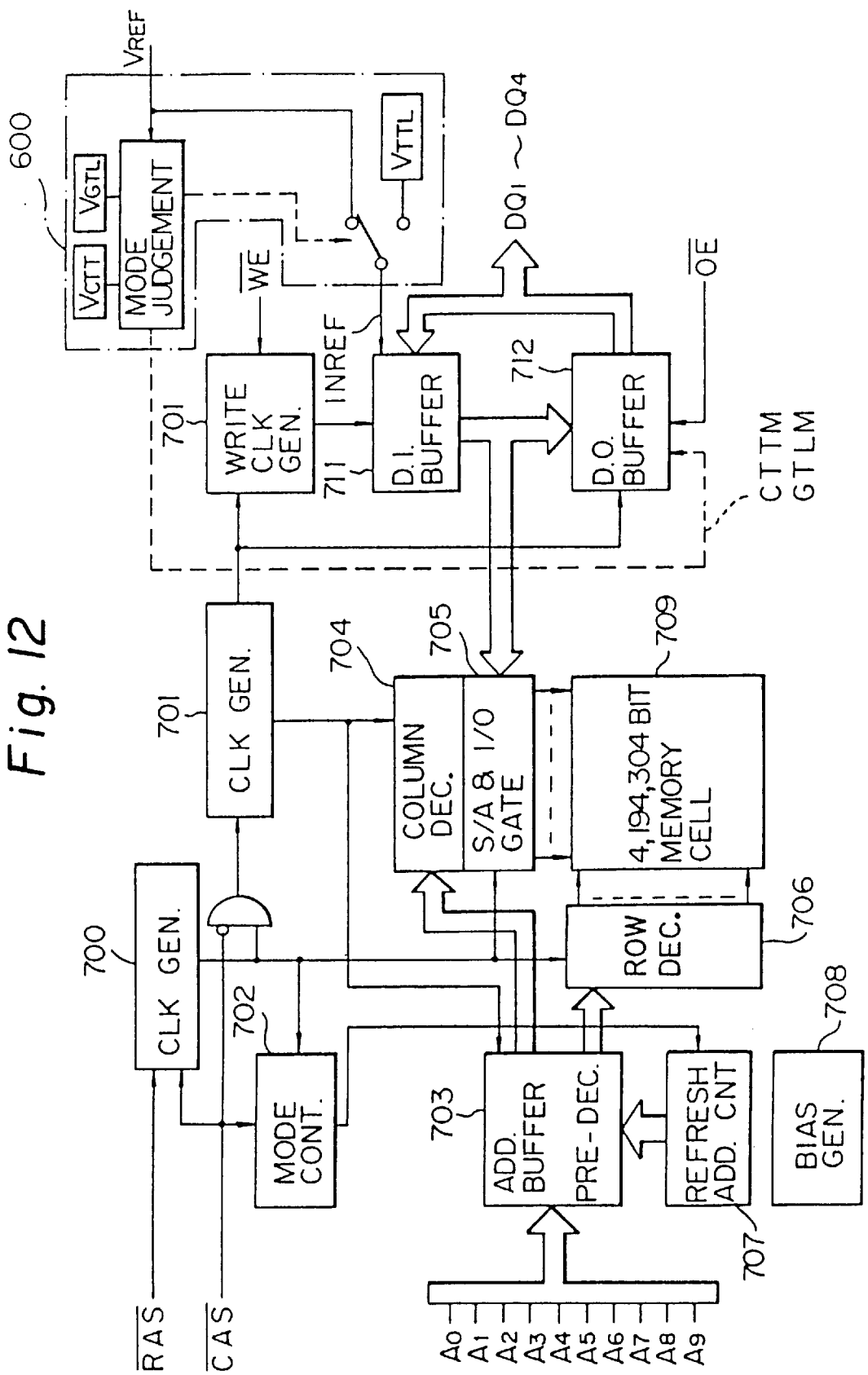
FIG. 12 is a diagram illustrating the whole constitution of a semiconductor memory of a first embodiment of the aspect of the present invention.

FIG. 12 is a block diagram of a semiconductor memory to which the present invention is adapted and in which the portion surrounded by a dot-dash chain line is a circuit 600 for automatically forming mode designation signals. In FIG. 12, reference numerals 700 and 701 denote clock generators, 702 denotes a mode control, 703 denotes an address buffer/address predecoder, 704 denotes a column decoder, 705 denotes a sense amplifier/I/O gate, 706 denotes a row decoder, 707 denotes a refresh address counter, 708 denotes a substrate bias generator, 709 denotes a memory cell array, 710 denotes a write clock generator, 711 denotes a data input buffer, and reference numeral 712 denotes a data output buffer. Symbol RAS denotes a raw address strobe signal, CAS denotes a column address strobe signal, $A_0$ to $A_9$ denote address signals, WE denotes a write enable signal, OE denotes an output enable signal, DQ1 to DQ4 denote input/output data, and symbol $V_{REF}$ denotes a reference voltage.

The data input buffer 711 and the data output buffer 712 constitute a transceiver for use with CTT, GTL and TTL. The data input buffer 711 is served with a reference voltage INREF from the circuit 600 which automatically forms mode designation signals, and the data output buffer 712 is served with two kinds of mode designation signals CTTM and GTLM.

Figure 13:
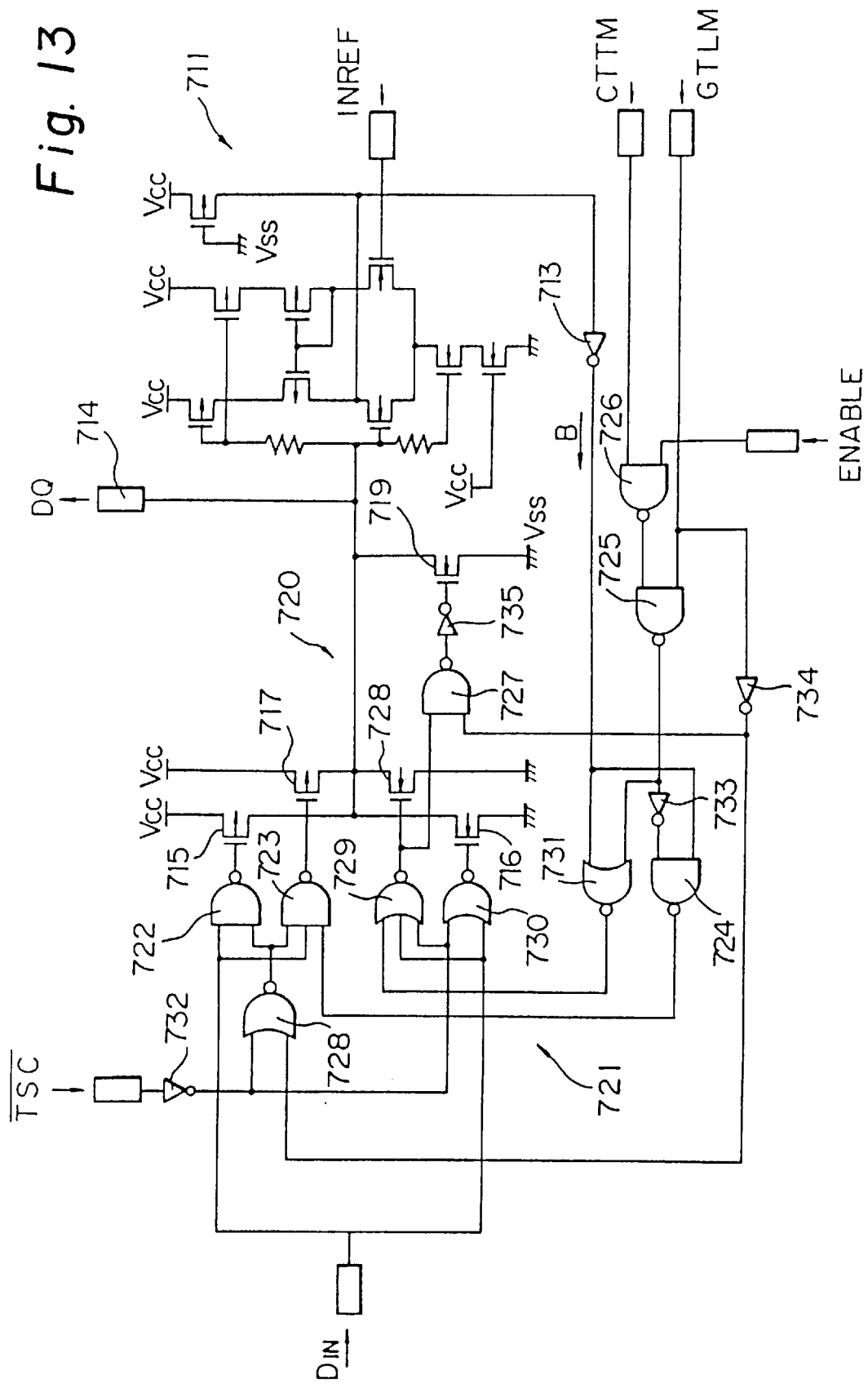
FIG. 13 is a diagram illustrating the constitution of an input/output circuit of the aspect of the present invention.

FIG. 13 is a diagram illustrating the constitution of the transceiver (constitution for one bit only). The data input buffer 711 has five PMOS transistors Q711A, Q711B, Q711C, Q711D, Q711E, four NMOS transistors Q711F, Q711G, Q711H, Q711I, and one inverter gate 713, and compares the potential at the data input/output terminal 714 with the reference voltage INREF, and renders the output (output of the inverter gate 713, hereinafter denoted by symbol A) to assume the high level when the INREF is lower.

The data output buffer 712 has a group of output transistors 720 including a first PMOS transistor 715 and a first NMOS transistor 716 connected in series between the high-potential power source $V_{cc}$ and the low-potential power source $V_{ss}$, a second PMOS transistor 717 and a second NMOS transistor 718 similarly connected in series, and a third NMOS transistor 719 connected in parallel with the first NMOS transistor 716 (or the second NMOS transistor 718).

The first and second PMOS transistors 715, 716 as well as the first to third NMOS transistors 717 to 719 are controlled for their turn on/off operation by a control circuit 721 which comprises NAND gates 722 to 727, NOR gates 728 to 731, and inverter gates 732 to 735.

Each of the operation modes will be described hereinbelow. In the following description, both the tri-state control signal TSC and the operation permit signal Enable have the high level.

[GTL]

First, when the signal CTTM and the signal GTLM have the low level (GTL mode), the output of the NAND gate 725 is fixed to the high level, and whereby the output of the NOR gate 731 is fixed to the low level and the output of the NAND gate 724 is fixed to the high level, so that the logic of the signal B is inhibited from being fed back to the side of the output buffer. At the same time, the output of the inverter gate 734 assumes the high level, the output of the NOR gate 728 assumes the low level and, hence, the outputs of the NAND gates 722 and 723 are fixed to the high level, the first and second PMOS transistors 715 and 717 are fixed to the off state, and the NMOS transistors only perform the open-drain operation in the group of output transistors 720. That is, when the logic of the data Din from the internal circuit is, for instance, low level, the outputs of the NOR gates 729 and 730 both assume the high level and, at the same time, the output of the inverter gate 735 assumes the high level, too. Therefore, the first and second NMOS transistors 716 and 718 are turned on and, in addition, the third NMOS transistor 719 is turned on, so that the input/output terminal 714 is efficiently driven by these three NMOS transistors. Thus, there is realized an output transistor which produces a large driving force required for the GTL mode.

[CTT]

Next, when the signal CTTM has the low level and the signal GTLM has the high level (CTT mode), the outputs of the NAND gate 725 and the inverter gate 734 both have the low level. Therefore, the logic of the signal B is fed back to the side of the output buffer, and the transistors constituting the group of output transistors 720 are turned on and off depending upon the logics of both the signal B and the data Din from the internal circuit.

That is, the logic of the signal B remains at the low level immediately after the logic of the data Din from the internal circuit has changed from the low level into the high level. Therefore, the outputs of the AND gates 722 and 723 assume the low level, the first and second PMOS transistors 715 and 717 are turned on, and the output terminal 714 are driven by these two PMOS transistors. Then, when the potential of the output terminal 714 becomes greater than the reference voltage INREF and the signal B assumes the high level after a predetermined period of time has passed, the output of the AND gate 724 assumes the low level, the output of the AND gate 723 assumes the high level, and the second PMOS transistor 717 is turned off. As a result, the subsequent output terminal 714 is driven by the first PMOS transistor 715 only, and the waveform of the data DQ is not distorted.

[TTL]

Next, when the signal CTTM and the signal GTLM have the high level (TTL mode), the output of the NAND gate 725 is fixed to the high level, the output of the NOR gate 731 assumes the low level and the output of the NAND gate 724 assumes the high level. Therefore, the transistors constituting the group of output transistors 720 operate in parallel depending upon the logic of the data Din from the internal circuit irrespective of the logic of the signal B, and work to efficiently drive the capacitive load connected to the output terminal 714.

As described above, according to this embodiment in which provision is made of switching elements 603 and 604 (see FIG. 9) which interrupt the power source current to the comparators 601, 602 (see FIG. 28) that judge the level of the reference voltage $V_{REF}$ when the potential of the reference voltage terminal 607 is $V_{cc}$ or is open, it is made possible to decrease the consumption of electric power during the operation in the TTL mode.

Moreover, since the third NMOS transistor 719 is connected in parallel with the first and second NMOS transistors 716 and 718 (see FIG. 13) and is permitted to operate in the predetermined operation modes (e.g., TTL and GTL modes), it is made possible to increase the drivability of the transistor of the pull-down side in the predetermined operation modes.

Moreover, since the reference voltage INREF used in the data input buffer 711 (see FIG. 32) is alternatively changed into either $V_{REF}$ or $V_{CTT}$, the reference voltage INREF is optimized for each of the operation modes in order to stabilize the operation of the data input buffer 711.

For a better understanding of the preferred embodiments, the related prior art will be explained with reference to FIGS. 14 and 15.

Figure 14:
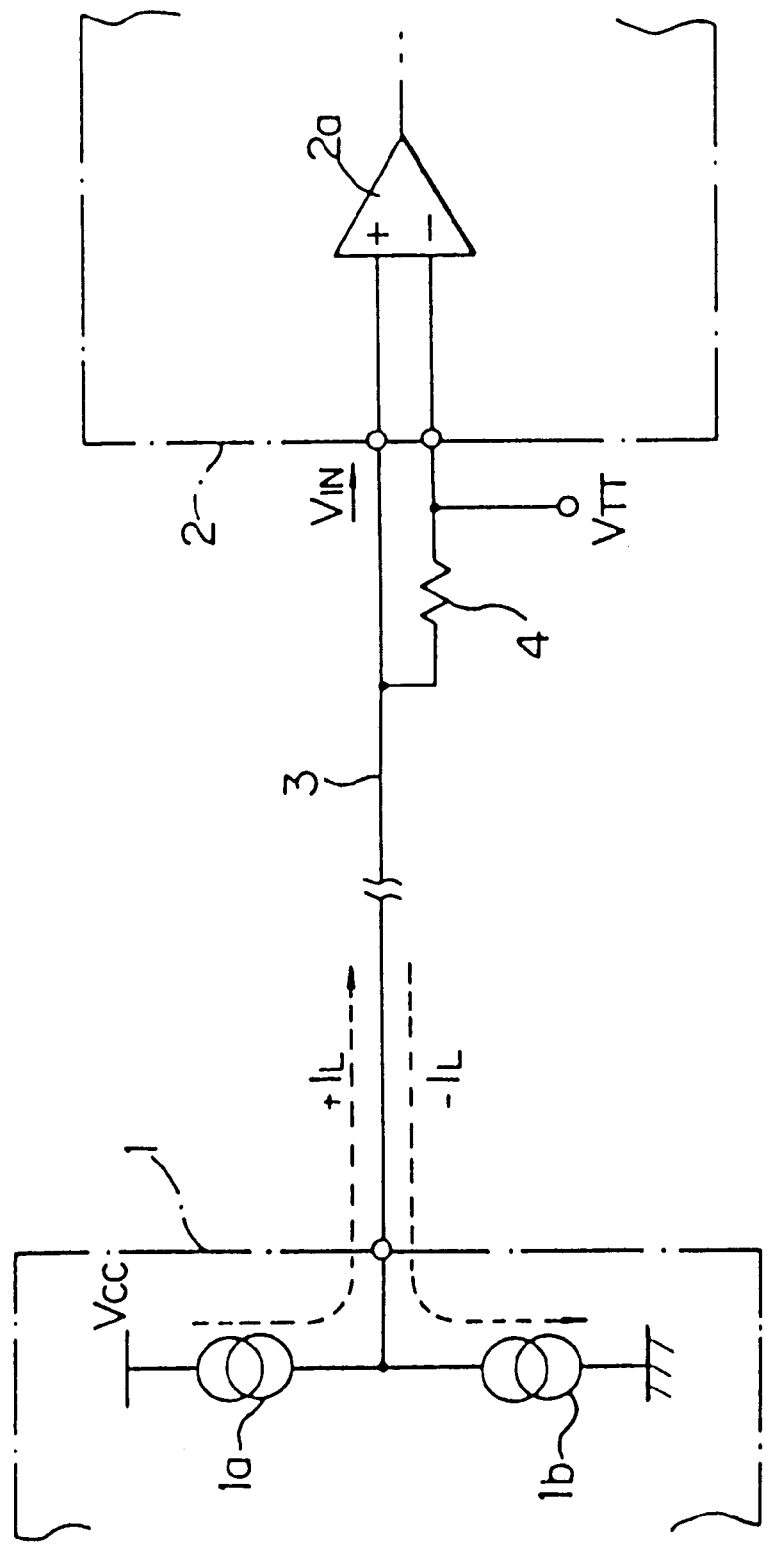
FIG. 14 is a diagram of a conventional constitution of a CTT interface.

FIG. 14 is a conceptual view of the CTT. In the CTT, a signal line 3 which is extended between a signal output unit 1 and a signal input unit 2 is connected to an intermediate power source $V_{TT}$ ($V_{TT}=V_{cc}/2$; $V_{TT}=+1.65$ V when $V_{cc}=+3.3$ V) through a resistor 4. The output unit 1 generally comprises a constant current element 1a on the H level side which connects the signal line 3 to the power source $V_{cc}$ when the logic of the signal to be outputted is the H level and a constant current element 1b on the L level side which connects the signal line 3 to the ground when the logic of the signal to be outputted is the L level. When the logic of the signal to be outputted is the H level, a current $+I_L$ flows from $V_{cc}$ to $V_{TT}$, and a potential $+I_L \times R_L$ (where $R_L$ is the value of a resistor 4) appears across both ends of the resistor 4. When the logic of the signal to be output is the L level, a current $-I_L$ flows from $V_{TT}$ to the ground in the opposite direction to the above, and a potential $-I_L \times R_L$ develops across both ends of the resistor 4. These potentials are applied to two inputs of a differential gate 2a of the input unit 2, and the potential relationship of the signal line 3 is judged with $V_{TT}$ as the reference potential. In other words, when $\pm I_L \times R_L > V_{TT}$, the H level of the input signal $V_{IN}$ applied through the signal line 3 is judged, and when $\pm I_L \times R_L < V_{TT}$, the L level of the input signal $V_{IN}$ is judged.

Figure 15:
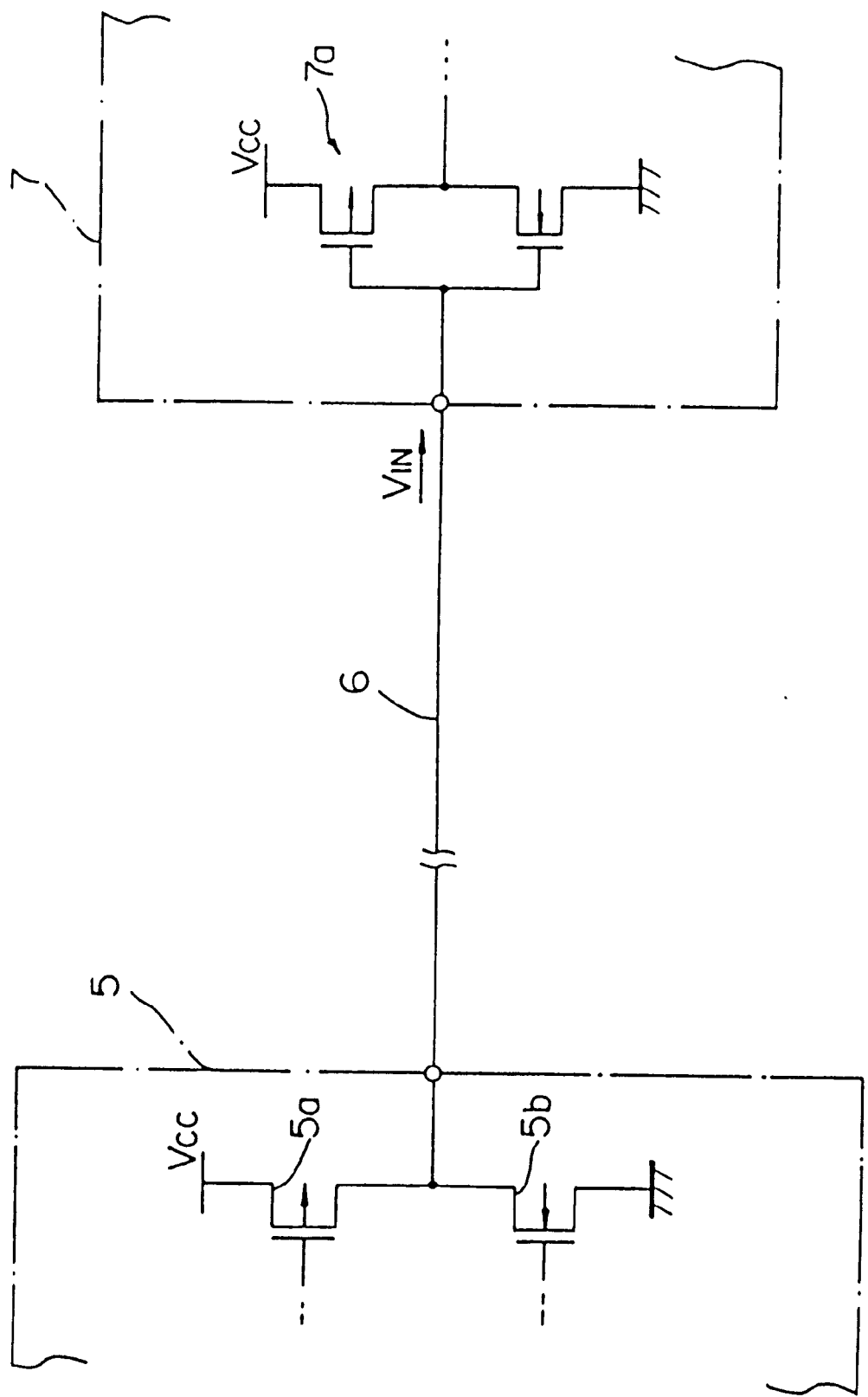
FIG. 15 is a diagram of a conventional constitution of a CMOS interface.

FIG. 15 is a conceptual view of the CMOS interface which is shown for comparison. One of the two transistors 5a, 5b of the output unit 5 is turned ON in accordance with the logic of the signal to be outputted. Assuming that the logic of the signal to be outputted is the H level, the P channel MOS transistor 5a is turned ON and the signal line 6 is driven by the power source $V_{cc}$, and when the logic of the signal to be outputted is the L level, on the other hand, the N channel MOS transistor 5b is turned ON and the signal line 6 is driven by the ground potential. A CMOS inverter gate 7a of the input unit 7 has a predetermined input threshold value $V_{INV}$, judges the H level when the potential of the input signal $V_{IN}$ given through the signal line 6 is higher than the input threshold value $V_{INV}$, and judges the L level when it is lower than $V_{INV}$.

Let's compare both interfaces of CMOS and CTT. Whereas the logical amplitude of CMOS is substantially a full current width (for example, 3.3 V), the amplitude of CTT has a value (for example, 400 mV) which is by far smaller and is determined by the driving current $\pm I_L$ and the $R_L$ value.

In the semiconductor integrated circuit according to the prior art described above, however, the semiconductor integrated circuit must be fabricated for each interface because it can use only the signal interface having a large amplitude or the signal interface having a small amplitude. Accordingly, the price of the semiconductor chip becomes higher and the management cost increases, too, due to the increase of the number of the total stock. From the aspect of users, the users must use those chips which are different with the standards of the interfaces, so that the system design becomes more troublesome.

Figure 16:
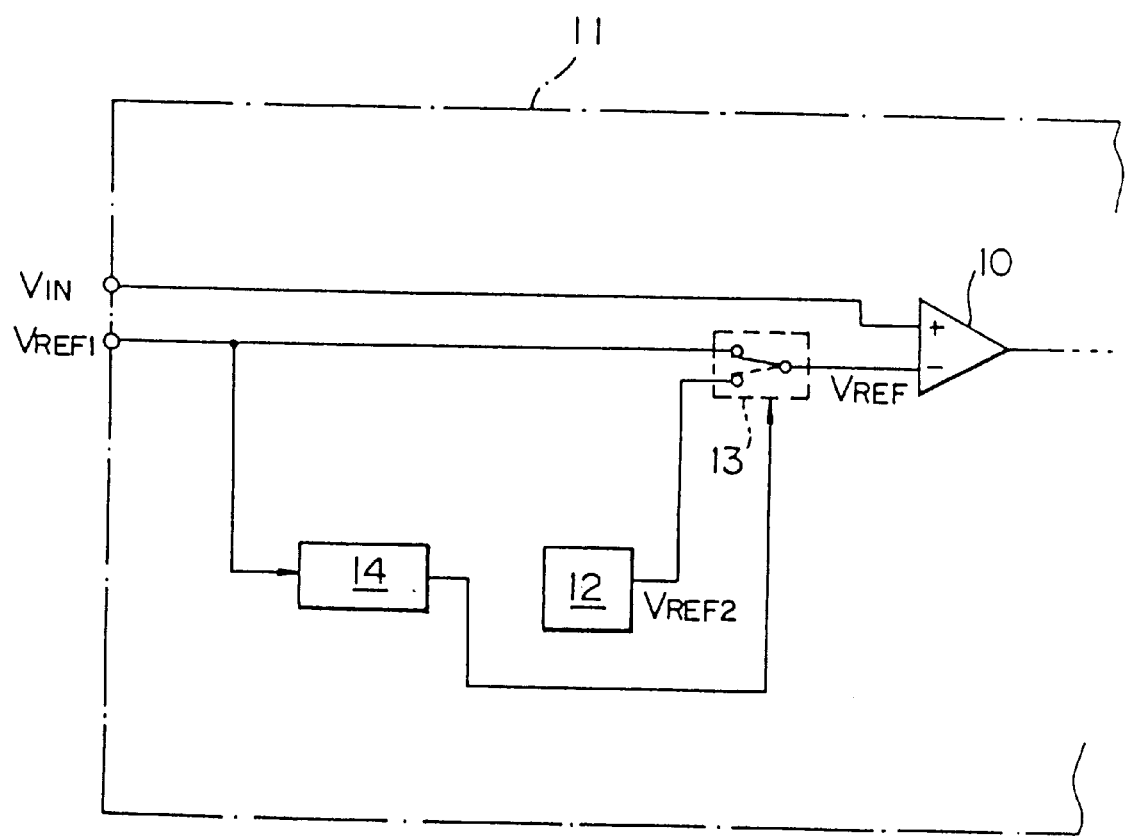
FIG. 16 is a diagram illustrating the principle and constitution of another aspect of the present invention.

To solve the problems with the prior art described above, in a semiconductor integrated circuit including a differential gate 10 for comparing the potential of the input signal $V_{IN}$ with the predetermined reference potential $V_{REF}$ and judging the logic of this input signal $V_{IN}$ as shown in FIG. 16, the semiconductor integrated circuit according to the present invention comprises selection means 13 for selecting either one of the first reference potential $V_{REF1}$ given from outside a chip 11 and the second reference potential $V_{REF2}$ generated by reference potential generation means 12 inside the chip, and instruction means 14 for instructing the selection means 13 to select the first reference potential $V_{REF1}$ when the first reference potential $V_{REF1}$ is given and instructing the selection means 13 to select the second reference potential $V_{REF2}$ when the first reference potential $V_{REF1}$ is not given.

If the first reference potential $V_{REF1}$ corresponds to a terminal potential $V_{TT}$ of the CTT interface and the second reference potential $V_{REF2}$ corresponds to a threshold value $V_{INV}$ of a CMOS inverter gate, for example, the comparison operation between $V_{REF1}$ and $V_{IN}$ and the comparison operation between $V_{REF2}$ and $V_{IN}$ are alternatively changed over in accordance with the existence or absence of the first reference potential $V_{REF1}$ from outside the chip. Therefore, the CTT interface can be accomplished by the former comparison operation and the CMOS interface, by the latter comparison operation. In other words, the present invention can provide a semiconductor integrated circuit having excellent compatibility which can be used in common for both of the signal interface having a large logical amplitude (CMOS, in this case) and the signal interface having a small logical amplitude (CTT, in this case).

Hereinafter, an embodiment of the present invention will be explained with reference to the drawings.

FIGS. 17 to 20 show the semiconductor integrated circuit according to an embodiment of the present invention, and represent the example which can be applied to both of the CMOS interface and the CTT interface.

Figure 17:
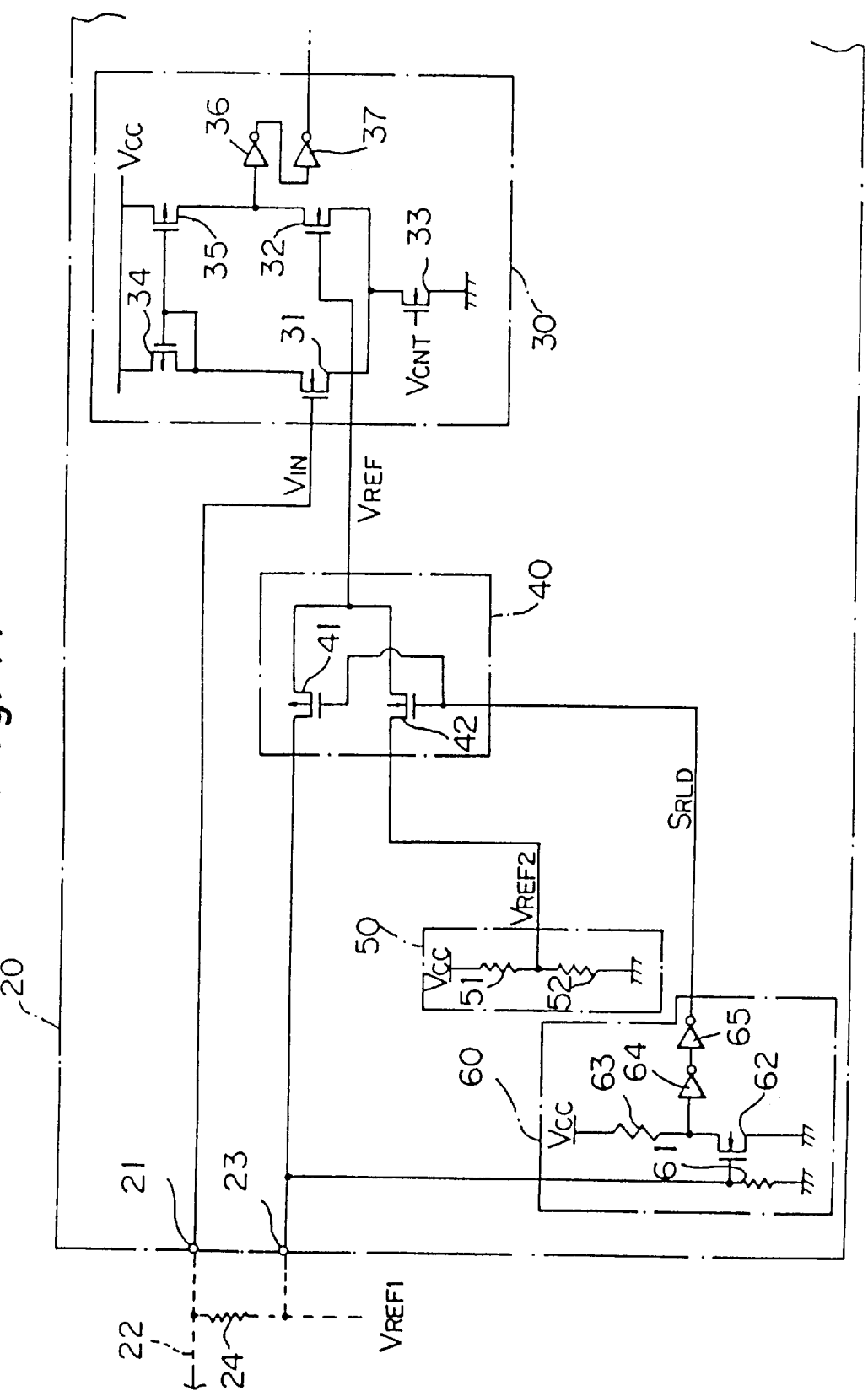
FIG. 17 is a diagram illustrating the constitution of the embodiment.

First of all, the structure will be explained. In FIG. 17, reference numeral 20 denotes a chip on the input side; 21 is an input terminal connected to a chip on the output side, shown outside, through a signal line 22; and 23 is a reference terminal connected to the signal line 22 through a resistor 24 and to a first reference potential $V_{REF1}$ having a potential corresponding to $V_{cc}/2$ (for example, +1.65 V).

A differential gate 30, selection means 40, reference potential generation means 50 and instruction means 60 are disposed inside the chip 20, and they have the following structures.

In the differential gate 30, the sources of a pair of N channel MOS transistors 31, 32 are connected in common to the ground through a constant current transistor 33, and the drains of these N channel MOS transistors 31, 32 are connected to the power source $V_{cc}$ through P channel MOS transistors 34, 35 having a current mirror structure, respectively. The output signal appearing at the drain of one of the N channel MOS transistors 32 is taken out in the same phase through inverter gates 36, 37 of two stages, and is applied into an internal circuit of the chip 20. Here, symbol $V_{IN}$ represents the input signal applied to the gate of the N channel MOS transistor 31, $V_{REF}$ is the reference potential applied to the gate of the N channel MOS transistor 32, and $V_{CNT}$ is a constant voltage.

The selection means 40 includes a P channel MOS transistor 41 and an N channel MOS transistor 42, outputs $V_{REF1}$ as $V_{REF}$ when a predetermined instruction signal $S_{RLD}$ has the L level and outputs the second reference potential $V_{REF2}$ as $V_{REF}$ generated by the reference potential generation means 50 when the instruction signal $S_{RLD}$ is at the high level. By the way, the reference potential generation means 50 consists of a resistance type potential division circuit formed by connecting in series at least two resistors 51, 52 between the power source $V_{cc}$ and the ground, and generates the second reference potential $V_{REF2}$ having a potential ($\approx$2.5 V) corresponding to the threshold value $V_{INV}$ of the CMOS level.

The instruction means 60 has the structure wherein a resistor 61 is interposed between a reference terminal 23 and the ground, the drain of an N channel MOS transistor 62, which uses the potential across both ends of this resistor 61 as the gate-source potential thereof, is connected to the power source $V_{cc}$ through a resistor 63, and the source of this transistor 62 is connected to the ground. When the potential across both ends of the resistor 62 (which potential is also the potential at the reference terminal 23) is higher than the threshold voltage $V_{th}$ of the transistor 62, the transistor 62 is turned ON, and an L level instruction signal $S_{RLD}$ is output through two-stage inverter gates 64, 65. When the potential across both ends of the resistor 61 is not higher than the threshold voltage $V_{th}$ of the transistor 62, on the other hand, the transistor 62 is turned OFF, and an H level instruction signal $S_{RLD}$ is outputted through the two-stage inverter gates 64, 65. In other words, the instruction signal $S_{RLD}$ is a signal which has the L logic level when $V_{REF1}$ is applied to the input terminal 23, and the H logic level when $V_{REF1}$ is not applied.

Next, the operation will be explained.

When the chip 20 is used with the CTT interface standard, $V_{REF1}$ is applied to the reference terminal 23. Then, the potential across both ends of the resistor 61 of the instruction means 60 becomes $V_{REF1}$, the transistor 62 is turned ON and the instruction signal $S_{RLD}$ is outputted at the L level.

In this case, therefore, the P channel MOS transistor 41 of the selection means 40 is turned ON and $V_{REF1}$ becomes equal to $V_{REF}$, so that the differential gate 30 judges the binary level of the input signal $V_{IN}$ with this $V_{REF1}$ (=+1.65 V) being the reference. (This is the judgement operation of the CTT interface.) When $V_{IN} > V_{REF1}$, for example, the drain current of the N channel MOS transistors 31 becomes greater by the difference between $V_{IN}$ and $V_{REF1}$ and flows, and the drain current of the other N channel MOS transistor 32 attempts to increase by the mirror ratio of the load transistors 34, 35. However, since the sum of both drain currents is made constant by the constant current transistor 33, the drain voltage of the other N channel MOS transistor 32 is pulled up in the $V_{cc}$ direction in such a manner as to supplement this insufficiency. After all, the differential gate 30 outputs the H level signal as the judgement result of $V_{IN} > V_{REF1}$.

When the chip 20 is used with the CMOS interface standard, on the other hand, no voltage is applied to the reference terminal 23. Then, the potential across both ends of the resistor 61 of the instruction means 60 becomes zero, so that the transistor 62 is turned OFF and the instruction signal $S_{RLD}$ is outputted at the H logic level.

In this case, since the N channel MOS transistor 42 of the selection means 40 is turned ON, $V_{REF2} = V_{REF}$ and the differential gate 30 judges the level of the input signal $V_{IN}$ using this $V_{REF2}$ ($\approx$+2.5 V) as the reference. (This is the judgement operation of the CMOS interface standard.)

According to the embodiment described above, the chip can be switched and used for the CTT interface and the CMOS interface depending on the existence of the voltage applied to the reference terminal 23. Therefore, one chip can be used for two interfaces and the semiconductor integrated circuit need not be fabricated for each interface. In other words, the cost of the semiconductor chip can be restricted and the management cost can be reduced due to the decrease of the number of the total stock. Further, from the aspect of the users, the system design becomes easier because the same chip can be used for different interfaces.

Figure 18:
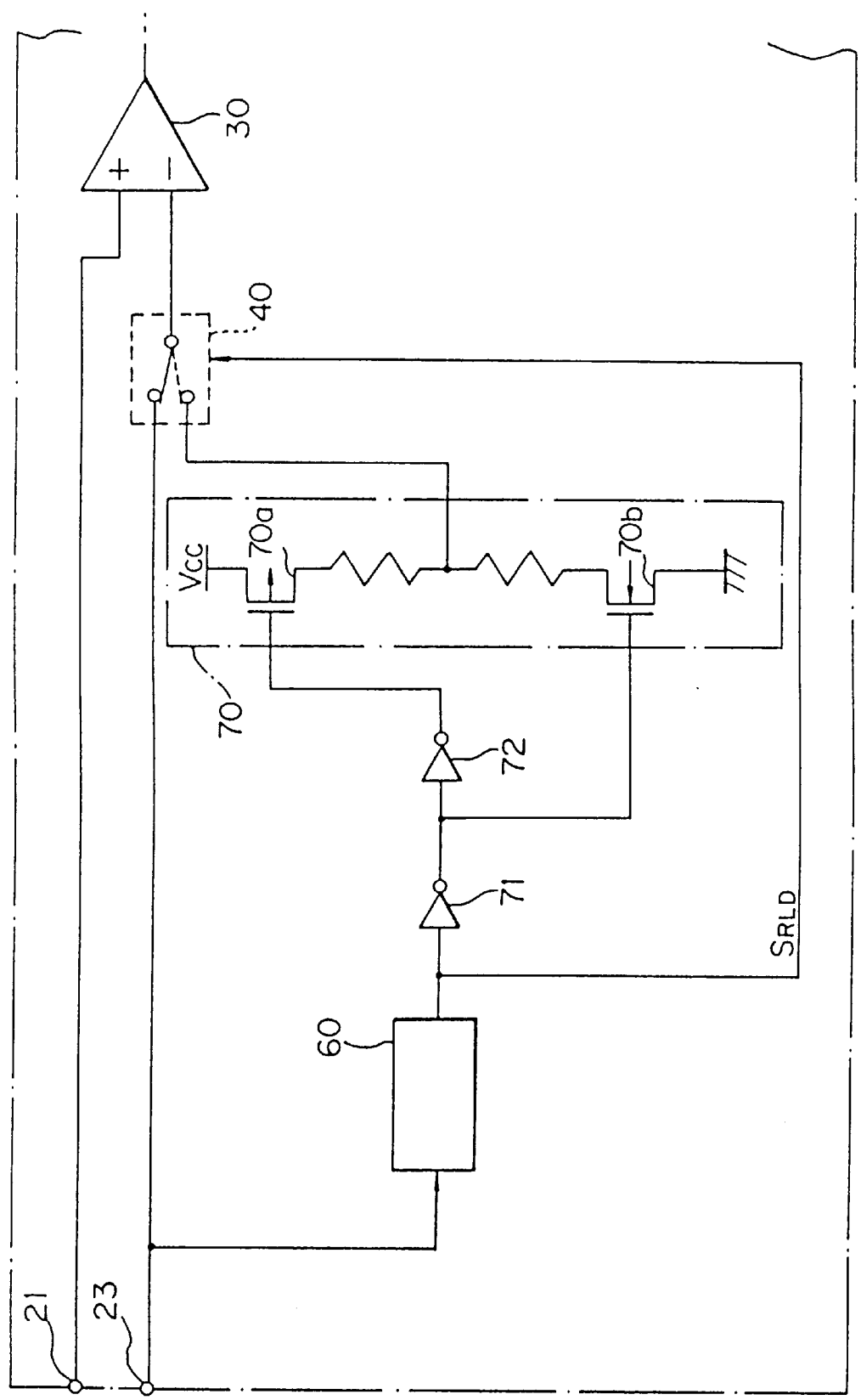
FIG. 18 is a diagram illustrating another constitution of the embodiment.

FIG. 18 shows a preferred modified example of the embodiment described above. In this example, when the chip is operated with the CTT interface standard, a switch element (a P channel MOS transistor 70b and an N channel MOS transistor 70c in the drawing) across both ends of a resistance circuit 70c of the reference potential generation means 70 is turned OFF, and unnecessary power consumption is restricted by stopping in this manner the operation of the reference potential generation means 70. An opposite phase instruction signal $S_{RLD}$ subjected to logic inversion by the inverter gate 71 and the same phase instruction signal $S_{RLD}$ subjected to further logic inversion by the inverter gate 72 are applied to the switch element. Further, the switch element may comprise only either of the P channel MOS transistor 70b and the N channel MOS transistor 70c.

Figure 19:
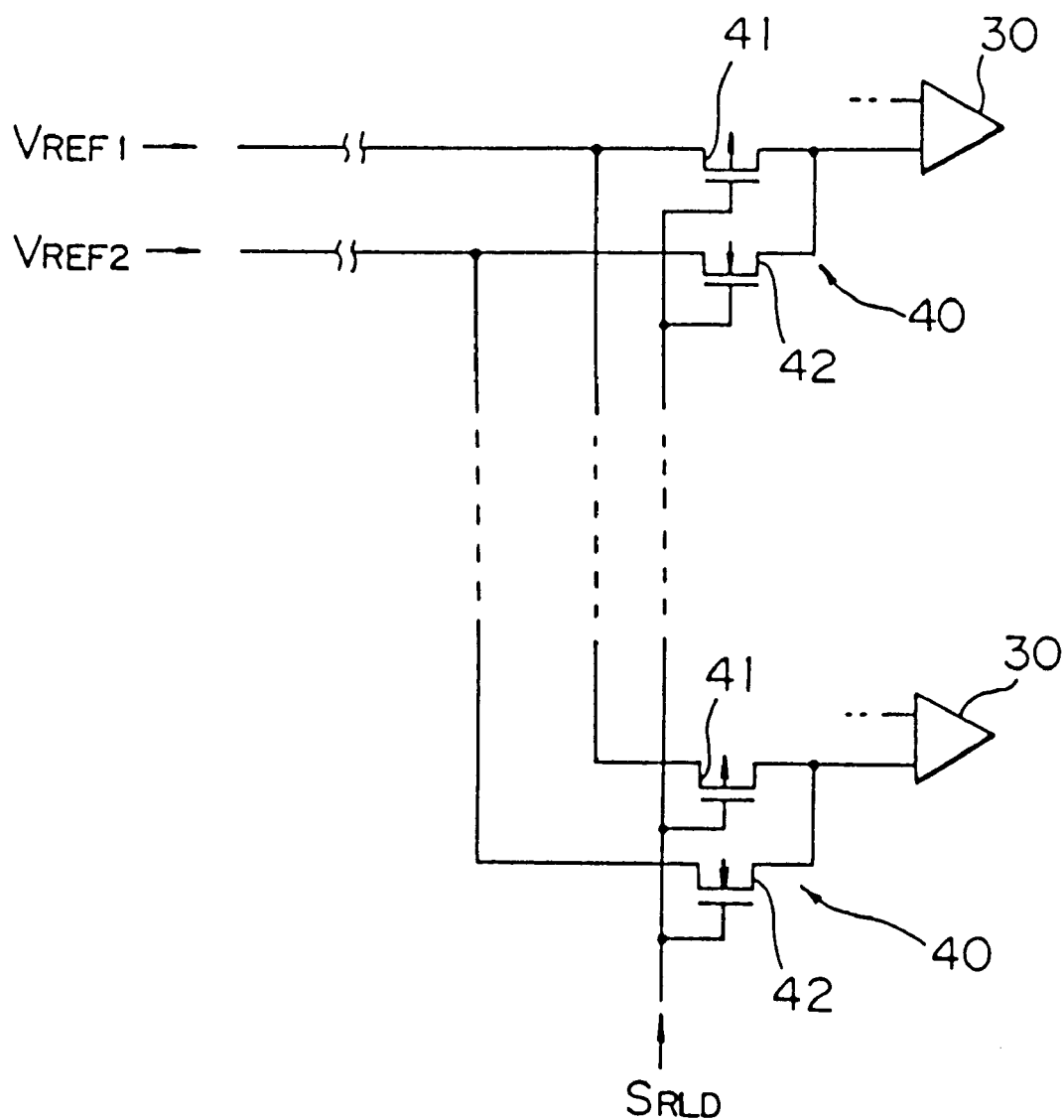
FIG. 19 is a diagram of preferred arrangement of a selection means of the embodiment.
Figure 20:
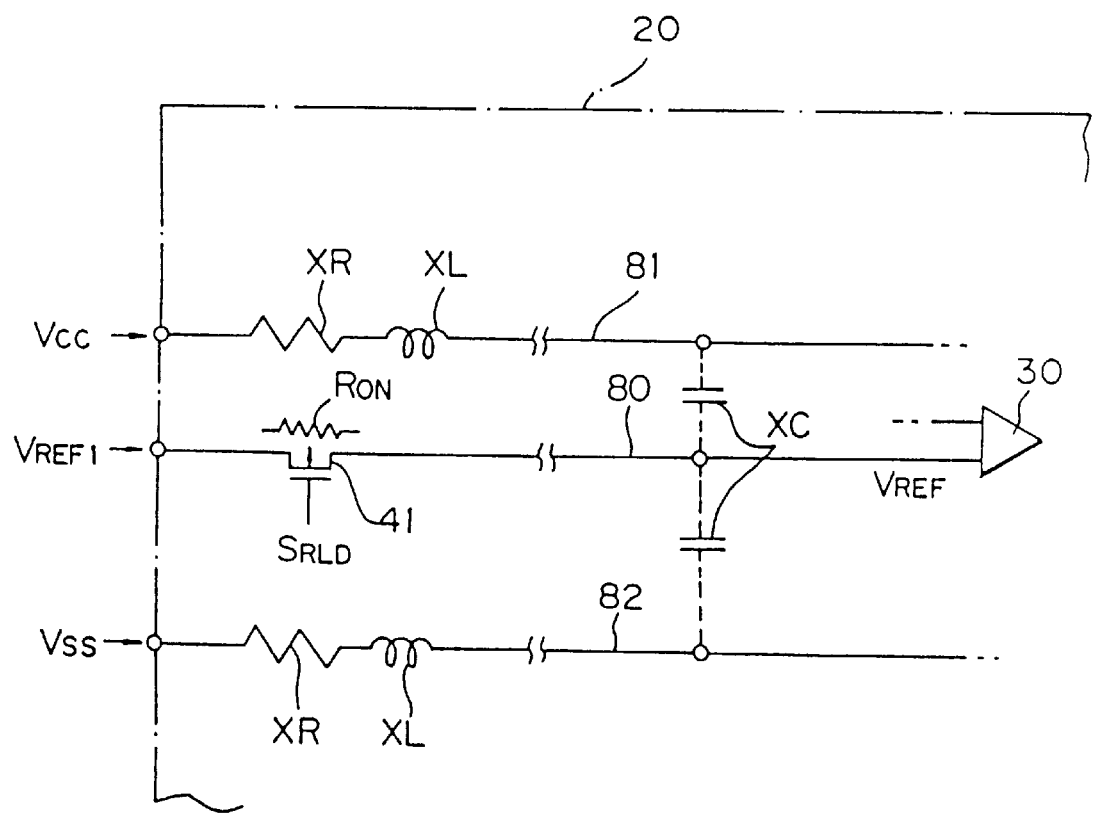
FIG. 20 is a diagram which schematically illustrates the effect of a change in the power source.

The selection means 40 is preferably disposed most closely to the differential gate 30 as shown in FIG. 19. If the selection means 40 and the differential gate 30 are spaced apart from each other, the reference potential of the differential gate 30 is likely to change with the fluctuation of the power source voltage. FIG. 20 is a structural view of principal portions including the P channel MOS transistor 41 of the selection means, the reference potential wiring 80 connecting this MOS transistor 41 to the differential gate 30, the $V_{cc}$ power source wiring 81 and the $V_{ss}$ (ground) power source wiring 82. Symbol XR represents the resistance of the power source wirings; XL is the inductance of the power source wirings; XC is the capacitance between the wirings; and $R_{ON}$ is the ON resistance of the MOS transistor 41.

In this circuit diagram, the current flowing through the power source wirings 81, 82 changes with the operation of the internal circuit of the chip 20, and a large current change occurs particularly when a large number of internal circuits are simultaneously switched. Therefore, the power source voltages instantaneously fluctuate due to XR and XL of the power source wirings and this voltage fluctuation is transmitted to the reference potential wiring 80 through XC. Consequently, the reference potential $V_{REF}$, which must be constant, changes in such a manner as to follow up the fluctuation of the power source voltages. To cope with this problem, it is effective to reduce XC, and this can be accomplished effectively by reducing the distance between the selection means 40 and the differential gate 30. Furthermore, it is preferred to reduce the impedance of $V_{REF1}$ viewed from the side of the differential gate 30 by reducing $R_{ON}$ as much as possible.

Although the embodiment described above represents the example where the chip is applied to the CMOS interface and the CTT interface, the present invention is not limited thereto, in particular. In short, the present invention can be applied to two kinds of interfaces having mutually different logical amplitudes, and can be applied, for example, to the TTL interface in place of the CMOS interface. In this case, $V_{REF2}$ is approximately +1.4 V. The present invention may also be applied to the GTL interface in place of the CTT interface. In this case, $V_{REF1}$ is approximately +1.2 V.

Figure 21:
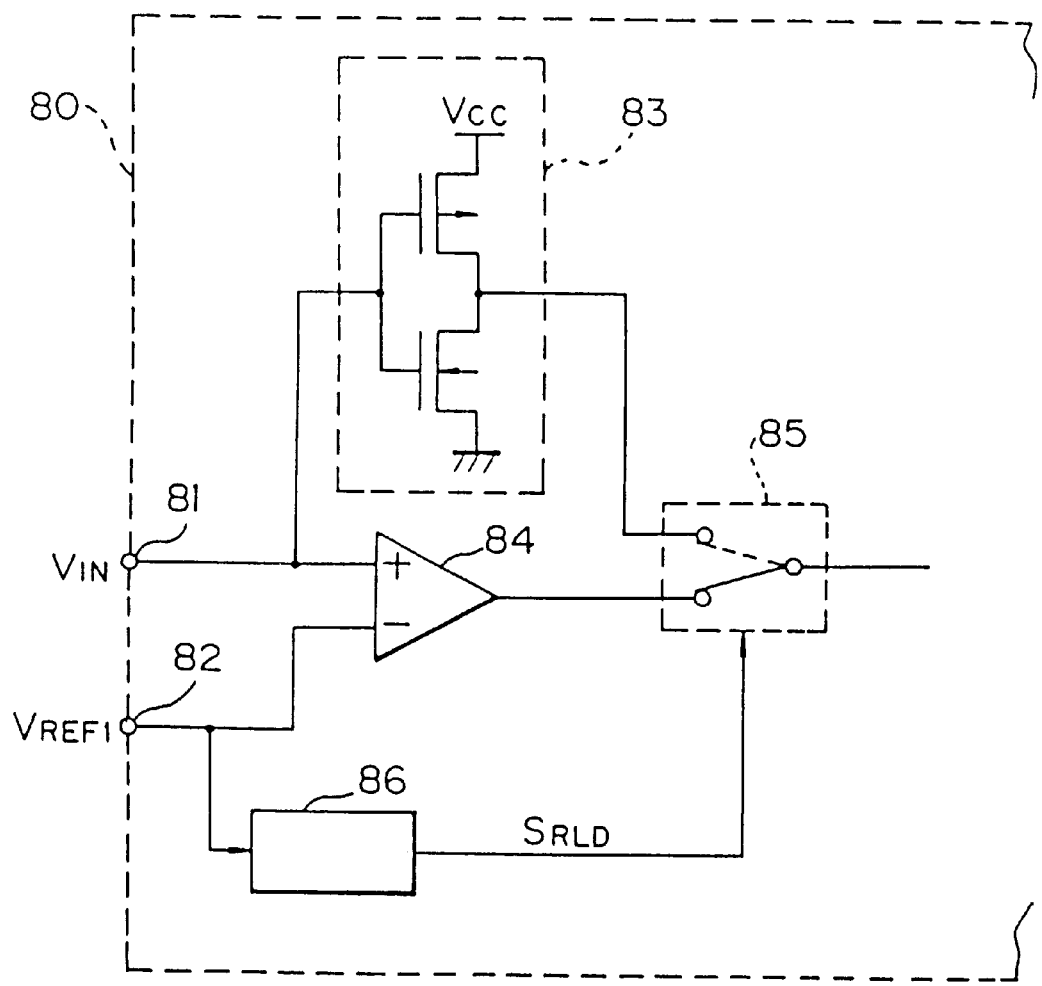
FIG. 21 is a diagram illustrating the constitution of major portions of another embodiment.

FIG. 21 shows the semiconductor integrated circuit according to another embodiment of the present invention. In this circuit diagram, reference numeral 80 denotes an input terminal for receiving the input signal $V_{IN}$ outside the chip; 82 is a reference terminal for receiving the reference potential $V_{REF1}$ (e.g. +1.6 V) from outside the chip; 83 is a CMOS inverter gate as a logic gate for discriminating the logic of the input signal $V_{IN}$ by comparing it with a predetermined input threshold value $V_{INV}$ (e.g. +2.5 V); 84 is a differential gate (for the detailed structure, refer to the differential gate 30 shown in FIG. 17) as a logic gate for discriminating the logic of the input signal $V_{IN}$ by comparing it with a predetermined input threshold value $V_{INV}$ (e.g. +2.5 V); 85 is a selection means (for the detailed structure, refer to the selection means 40 shown in FIG. 17); and 80 is instruction means for providing an instruction so as to select the output of the differential gate 84 when the reference potential $V_{REF1}$ is given, and to select the output of the CMOS inverter gate 83 when the reference potential $V_{REF1}$ is not given (for the detailed structure, refer to the instruction means 60 shown in FIG. 17).

In the circuit construction described above, when the reference potential $V_{REF1}$ is given from outside the chip, the selection means 85 selects the output of the differential gate 84 and when the reference potential $V_{REF1}$ is not given, the output of the CMOS inverter gate 83 is selected. Accordingly, this embodiment, too, can commonly use two interfaces by one chip in the same way as the foregoing embodiment.

Although the present invention has been disclosed and described by way of several embodiments, it is apparent to those skilled in the art that other embodiments and modifications of the present invention are possible without departing from the spirit or essential features thereof.

We claim:

1. A semiconductor integrated circuit in the form of a chip, comprising a differential gate for comparing a potential of an input signal with a predetermined reference potential and for discriminating a logic of said input signal;

a selector for selecting either one of a first reference potential given from outside said chip and a second reference potential generated by a reference potential generation circuit inside the chip and for outputting the selected reference potential as said predetermined reference potential; and an instruction circuit for instructing said selector to select said first reference potential when said first reference potential is given, and for instructing said selector to select said second reference potential when said first reference potential is not given.

2. The semiconductor integrated circuit according to claim 1, wherein said differential gate comprises a pair of MOS transistors responsive to said input signal and said predetermined reference potential, respectively;

a MOS transistor which is connected between respective sources of said pair of MOS transistors and a first power supply line and which functions as a constant current source; and MOS transistors in the form of a current mirror circuit connected between respective drains of said pair of MOS transistors and a second power supply line.

3. The semiconductor integrated circuit according to claim 2, wherein said selector comprises a P channel MOS transistor and an N channel MOS transistor responsive to an instruction signal from said instruction circuit, respectively, wherein either one of said first reference potential and said second reference potential is transmitted as said predetermined reference potential, to a gate of one of said pair of MOS transistors in said differential gate.

4. The semiconductor integrated circuit according to claim 3, wherein said instruction circuit makes a logic level of said instruction signal low or high in accordance with whether said first reference potential is given or not.

5. The semiconductor integrated circuit according to claim 4, wherein said reference potential generation circuit has the form of a resistance type potential division circuit comprising at least two resistors connected in series, and wherein said second reference potential is taken out from a connection point of said at least two resistors.

6. The semiconductor integrated circuit according to claim 4, wherein said reference potential generation circuit has the form of a resistance type potential division circuit comprising at least two resistors connected in series, and at least one switch element which is inserted in series into said resistance type potential division circuit and which is turned ON or OFF in accordance with said instruction signal, and wherein said second reference potential is taken out from a connection point of said at least two resistors.

7. The semiconductor integrated circuit according to claim 6, wherein said at least one switch element is either one of a P channel MOS transistor and an N channel MOS transistor.

8. The semiconductor integrated circuit according to claim 6, wherein said selector is disposed adjacent of said differential gate.

9. A semiconductor integrated circuit in the form of a chip, comprising a logic gate for comparing an input signal with a predetermined input threshold value and for discriminating a logic of said input signal;

a differential gate for comparing said input signal with a reference potential given from outside said chip and for discriminating the logic of said input signal;

a selector for selecting either one of an output of said logic gate and an output of said differential gate; and an instruction circuit for instructing said selector to select the output of said differential gate when said reference potential is given, and for instructing said selector to select the output of said logic gate when said reference potential is not given.

10. The semiconductor integrated circuit according to claim 9, wherein said logic gate is constituted by a CMOS inverter having a P channel MOS transistor and an N channel MOS transistor connected in series between different power supply lines.

11. A semiconductor integrated circuit comprising:

a first comparator for comparing an input voltage with a first predetermined reference potential and, based on a result of the comparing, for outputting a first operation mode designation signal;

a second comparator for comparing said input voltage with a second predetermined reference potential which is different from said first predetermined reference potential and, based on a result of the comparing, for outputting a second operation mode designation signal;

a first switching circuit which interrupts a power source current for said first comparator;

a second switching circuit which interrupts a power source current for said second comparator; and a control circuit which turns said first and second switching circuits off when said input voltage is at a predetermined level.

12. The semiconductor integrated circuit according to claim 11, wherein each of said first and second predetermined reference potentials is greater than said input voltage, and said first predetermined reference potential is greater than said second predetermined reference potential.

13. The semiconductor integrated circuit according to claim 11, further comprising a third switching circuit which selects either one of said input voltage and a third predetermined reference potential based upon said output from said first comparator.

14. The semiconductor integrated circuit according to claim 13, wherein said first comparator comprises a pair of MOS transistors responsive to said input voltage and said first predetermined reference potential, respectively;

a MOS transistor connected between respective sources of said pair of MOS transistors and a first power supply line and functions as a constant current source; and MOS transistors in the form of a current mirror circuit connected between respective drains of said pair of MOS transistors and said first switching circuit.

15. The semiconductor integrated circuit according to claim 14, wherein said first switching circuit comprises a pair of MOS transistors responsive to said input voltage and connected between a second power supply line providing said power source current and each source of the MOS transistors constituting said current mirror circuit.

16. The semiconductor integrated circuit according to claim 13, wherein said second comparator comprises a pair of MOS transistors responsive to said input voltage and said second predetermined reference potential, respectively;

a MOS transistor connected between respective sources of said pair of MOS transistors and a first power supply line and functions as a constant current source; and MOS transistors in the form of a current mirror circuit connected between respective drains of said pair of MOS transistors and said second switching circuit.

17. The semiconductor integrated circuit according to claim 16, wherein said second switching circuit comprises a pair of MOS transistors responsive to said input voltage and connected between a second power supply line providing said power source current and each source of the MOS transistors constituting said current mirror circuit.

18. The semiconductor integrated circuit according to claim 13, further comprising a circuit for generating voltages of said first, second and third predetermined reference potentials, said circuit including at least two resistors connected in series between different power supply lines, and wherein said first, second and third predetermined reference potentials are obtained by dividing a voltage between the different power supply lines by said at least two resistors.

19. A semiconductor integrated circuit comprising:

an input circuit for discriminating a logic of an input signal by comparing said input signal with a reference voltage;

an external voltage receiving terminal for receiving an external voltage supplied from outside said semiconductor integrated circuit;

an internal voltage generation circuit for generating an internal voltage as said reference voltage;

a selector for selectively supplying either one of said external voltage and said internal voltage as said reference voltage, in accordance with a potential of said external voltage.

20. The semiconductor integrated circuit according to claim 19, wherein said selector selects said external voltage as said reference voltage when the potential of said external voltage is at a specific value, and said selector selects said internal voltage when the potential of said external voltage is not at the specific value.

21. The semiconductor integrated circuit according to claim 19, wherein said input circuit comprises:

a pair of MOS transistors responsive to said input signal and said reference voltage, respectively;

a MOS transistor which is connected between respective sources of said pair of MOS transistors and a first power supply line and which functions as a constant current source; and MOS transistors in the form of a current mirror circuit connected between respective drains of said pair of MOS transistors and a second power supply line.

22. The semiconductor integrated circuit according to claim 21, wherein said selector comprises:

a P channel MOS transistor and an N channel MOS transistor responsive to an instruction signal, respectively, wherein either one of said external voltage and said internal voltage is transmitted as said reference voltage, to a gate of one of said pair of MOS transistors in said input circuit.

23. The semiconductor integrated circuit according to claim 22, wherein a logic level of said instruction signal is set at a low or a high level, in accordance with whether said external voltage is at the specific value or not.

24. The semiconductor integrated circuit according to claim 23, wherein said internal voltage generation circuit has the form of a resistance type potential division circuit comprising at least two resistors connected in series, and wherein said internal voltage is taken out from a connection point of said at least two resistors.

25. The semiconductor integrated circuit according to claim 23, wherein said internal voltage generation circuit has the form of a resistance type potential division circuit comprising at least two resistors connected in series, and at least one switch element which is inserted in series into said resistance type potential division circuit and which is turned ON or OFF in accordance with said instruction signal, and wherein said internal voltage is taken out from a connection point of said at least two resistors.

26. The semiconductor integrated circuit according to claim 25, wherein said at least one switch element is either one of a P channel MOS transistor and an N channel MOS transistor.

27. The semiconductor integrated circuit according to claim 25, wherein said selector is disposed adjacent said input circuit.

28. A semiconductor integrated circuit comprising:
a logic gate for comparing an input signal with a predetermined input threshold value for discriminating a logic of said input signal;
a differential gate for comparing said input signal with a reference potential supplied from outside said semiconductor integrated circuit; and
a selector for selecting either one of an output of said logic gate and an output of said differential gate, in accordance with a value of said reference potential.

29. The semiconductor integrated circuit according to claim 28, wherein said selector selects the output of said differential gate when the reference potential is at a specific value, and said selector selects the output of said logic gate when the reference potential is not at the specific value.

30. The semiconductor integrated circuit according to claim 29, wherein said logic gate is constituted by a CMOS inverter having a P channel MOS transistor and an N channel MOS transistor connected in series between different power supply lines.

31. A semiconductor integrated circuit comprising:
a terminal for receiving an external voltage;
an input circuit discriminating a logic level of an input signal, said input circuit having a first mode in which the logic level of said input signal having a first amplitude is discriminated by comparing it with said external voltage and a second mode in which the logic level of said input signal having a second amplitude is discriminated, wherein the first and second amplitudes are different from each other; and
a mode judgement circuit, connected to said terminal, generating a control signal which indicates whether said external voltage is a predetermined reference value for the first mode, wherein the first mode and the second mode are switched in response to said control signal.

32. The semiconductor integrated circuit according to claim 31, wherein said control signal indicates the second mode when a value of said external voltage is different from the predetermined reference value.

33. The semiconductor integrated circuit according to claim 31, wherein said control signal indicates the second mode when said terminal is open.

34. The semiconductor integrated circuit according to claim 31, wherein said input circuit comprises a comparator receiving said input signal and a reference voltage, the external voltage is supplied to said comparator as said reference voltage during the first mode and an internal voltage is supplied to said comparator as said reference voltage during the second mode.

35. The semiconductor integrated circuit according to claim 31, wherein said input circuit comprises a first transistor controlled by said input signal, a second transistor controlled by said reference voltage, a first switch connected between a first power source line and a common connection node of said first and second transistors, a current mirror circuit connected to said first and second transistors, and a second switch connected between said current mirror circuit and a second power source line, said first and second switches being complementarily controlled in response to said input signal.

36. The semiconductor integrated circuit according to claim 35, wherein said first switch comprises an N-channel transistor having a gate receiving said input signal through a first impedance element, and said second switch comprises a P-channel transistor having a gate receiving said input signal through a second impedance element.

37. The semiconductor integrated circuit according to claim 36, wherein each of said first and second impedance elements comprises a resistor.

38. The semiconductor integrated circuit according to claim 36, wherein each of said first and second impedance elements comprises an integration circuit.

39. The semiconductor integrated circuit according to claim 35, wherein said first switch comprises a P-channel transistor having a gate receiving said input signal through a first impedance element, and said second switch comprises an N-channel transistor having a gate receiving said input signal through a second impedance element.

40. The semiconductor integrated circuit according to claim 39, wherein each of said first and second impedance elements comprises a resistor.

41. The semiconductor integrated circuit according to claim 36, wherein said first switch further comprises an N-channel transistor, connected between said common connection node and said first power source line, having a gate connected to said second power source line.

42. The semiconductor integrated circuit according to claim 31, wherein the second amplitude is larger than the first amplitude.

43. The semiconductor integrated circuit according to claim 31, wherein said terminal is pulled up by a resistor.

44. The semiconductor integrated circuit according to claim 31, wherein said mode judgement circuit comprises a comparator receiving said external voltage and discriminating whether said external voltage is the predetermined reference value.

45. The semiconductor integrated circuit according to claim 44, wherein said comparator comprises a first transistor controlled by said external voltage, a second transistor controlled by a voltage for discriminating the predetermined reference value, a common connection node of said first and second transistors being operatively connected to a first power source line, a first switch connected between a second power source line and said first and second transistors, and a current mirror circuit connected between said first switch and said first and second transistors, said first switch being controlled in response to said external voltage.

46. The semiconductor integrated circuit according to claim 45, wherein said first and second transistors are first and second N-channel transistors, said first transistor has a gate connected to said terminal via a resistor and to said first power source line via a capacitor, said first switch comprises a P-channel transistor having a gate responsive to said external voltage.

47. The semiconductor integrated circuit according to claim 31, wherein said input circuit comprises a comparator comparing said input signal with said external voltage, a logic gate receiving said input signal and having a predetermined threshold level, one of outputs from said comparator and said logic gate is selected in accordance with said control signal.

48. The semiconductor integrated circuit according to claim 46, wherein said logic gate comprises a CMOS inverter.

49. A semiconductor memory device comprising:

a data input buffer discriminating logic level of an input signal on the basis of a reference voltage;

a terminal for receiving an external reference voltage;

a mode judgement circuit, connected to said terminal, generating a control signal in accordance with a value of said external reference voltage; and a selector selectively supply either one of said external reference voltage and an internal reference voltage as said reference voltage to said data input buffer in response to said control signal.

* * * * *